United States Patent
Fujioka et al.

(10) Patent No.: US 7,239,569 B2
(45) Date of Patent: Jul. 3, 2007

(54) SEMICONDUCTOR MEMORY DEVICE AND MEMORY SYSTEM

(75) Inventors: Shinya Fujioka, Kawasaki (JP); Kotoku Sato, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/488,785

(22) Filed: Jul. 19, 2006

(65) Prior Publication Data

US 2006/0256639 A1    Nov. 16, 2006

Related U.S. Application Data

(62) Division of application No. 11/024,737, filed on Dec. 30, 2004, now Pat. No. 7,102,949.

(30) Foreign Application Priority Data

May 21, 2004  (JP)  .............................. 2004-152301
May 21, 2004  (JP)  .............................. 2004-152302

(51) Int. Cl.
    *G11C 7/00*    (2006.01)

(52) U.S. Cl. ............. 365/222; 365/189.05; 365/230.08
(58) Field of Classification Search ................ 365/222, 365/189.04, 189.05, 230.05, 230.08
See application file for complete search history.

(56) References Cited

U.S. PATENT DOCUMENTS

| 6,646,944 | B2 * | 11/2003 | Shimano et al. ............. 365/222 |
| 6,795,363 | B2 * | 9/2004 | Nakashima et al. ........ 365/222 |
| 6,801,468 | B1 * | 10/2004 | Lee ............................ 365/222 |
| 6,842,391 | B2 | 1/2005 | Fujioka et al. |
| 6,947,345 | B2 | 9/2005 | Takahashi et al. |
| 7,002,868 | B2 | 2/2006 | Takahashi |

FOREIGN PATENT DOCUMENTS

JP    11016346 A    1/1999
WO    98/56004 A1   12/1998

\* cited by examiner

*Primary Examiner*—Richard T. Elms
*Assistant Examiner*—Toan Le
(74) *Attorney, Agent, or Firm*—Arent Fox LLP

(57) ABSTRACT

A command register holding a decoded result of information relating to an access request supplied from an outside and an address register are provided, and decode of the information relating to an access request from the outside in a processing circuit, namely, a chip control circuit and an address decoder, and an operation corresponding to the external access request in a memory cell array by an access control circuit are made executable independently in parallel, whereby access requests from the outside can be inputted in multiple, and a pipelined operation can be realized for decode and an operation corresponding to the external access request in the memory cell array, thus making it possible to speed up the access operation to a semiconductor memory device without causing any problem.

25 Claims, 19 Drawing Sheets

F I G. 7
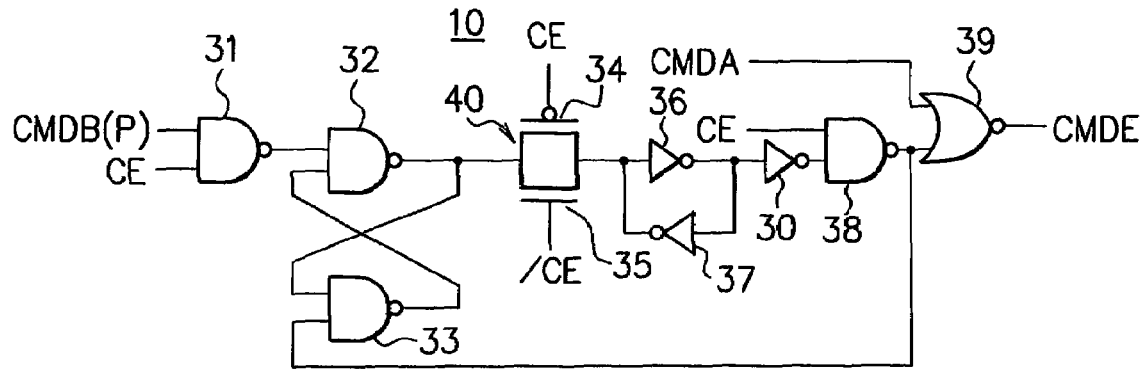
F I G. 8
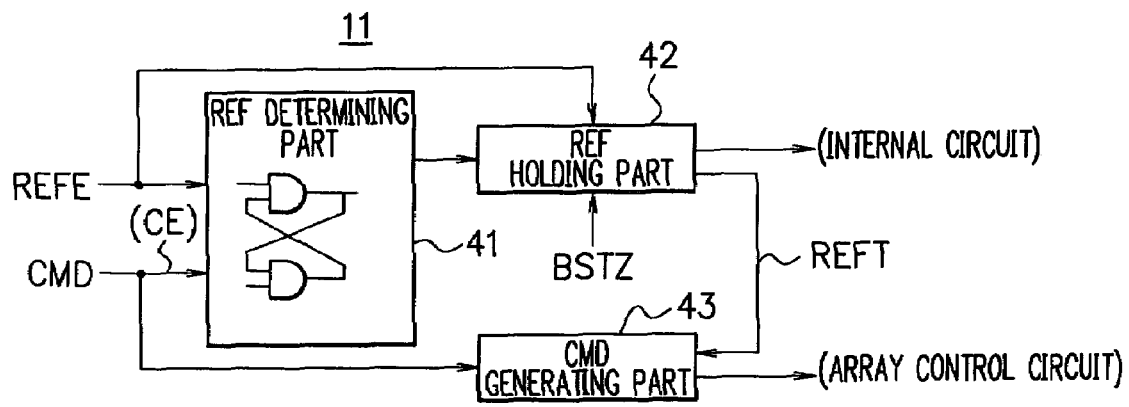
F I G. 9
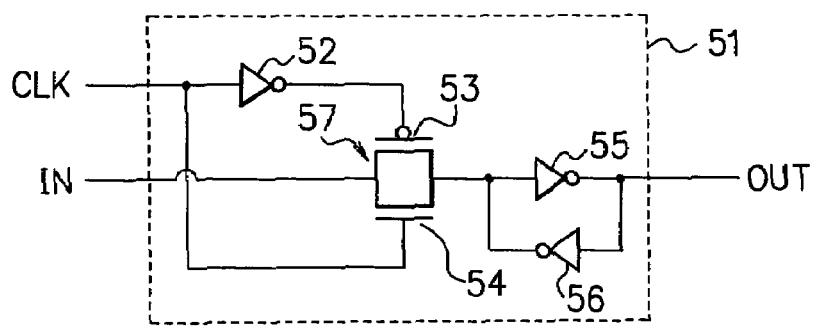

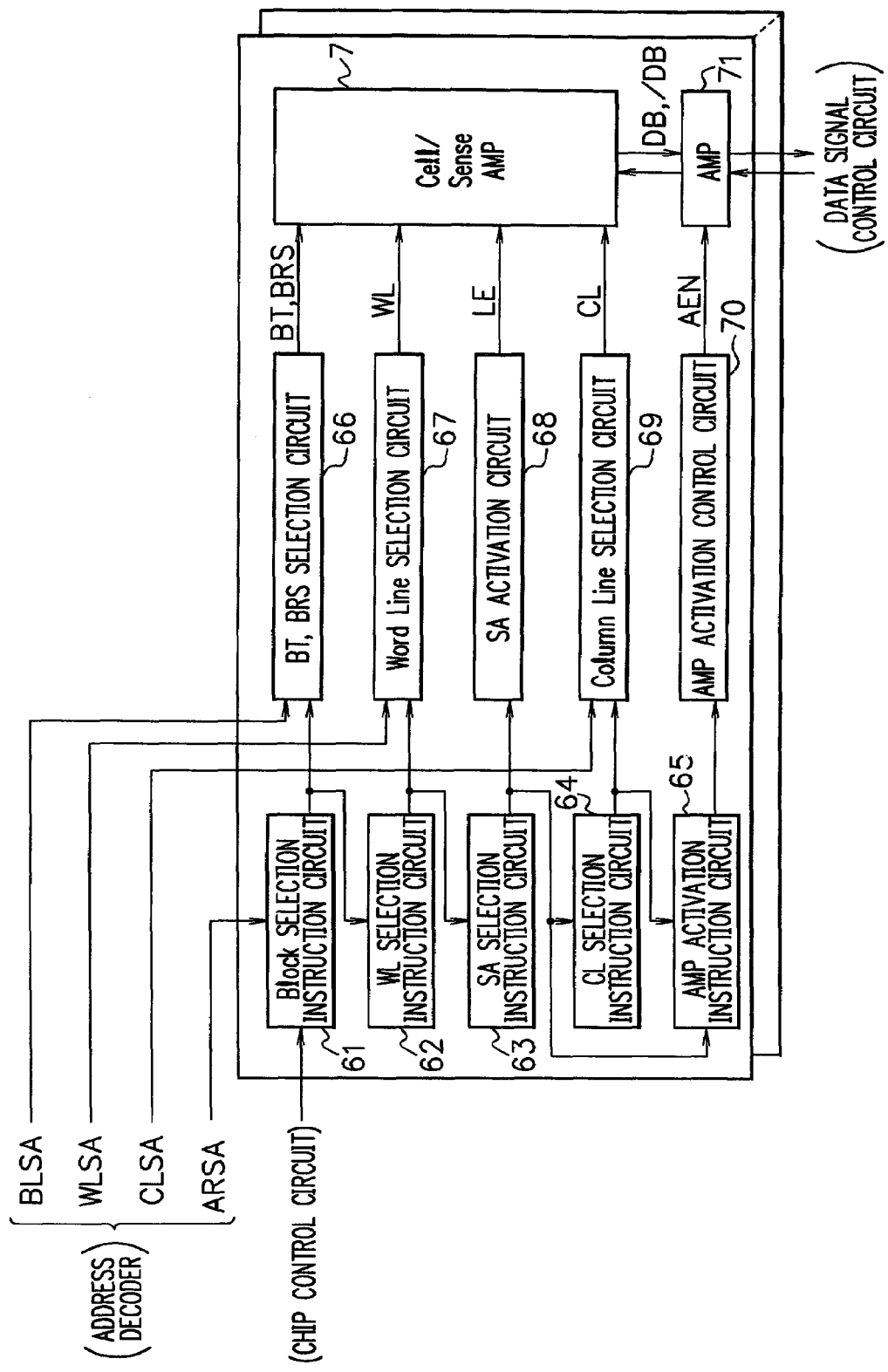

FIG. 17A (REF PIN)

|         | /CE | /OE | /WE | REFE |
|---------|-----|-----|-----|------|
| RD      | L   | L   | H   | H    |
| WR      | L   | H   | L   | H    |
| REF     | H   | H   | H   | L    |
| Standly | H   | X   | X   | H    |

X: Don't Care

FIG. 17B (CMD INPUT)

|         | /CE    | /OE | /WE |
|---------|--------|-----|-----|
| RD      | L      | L   | H   |
| WR      | L      | H   | L   |
| REF     | Lpulse | H   | H   |
| Standly | H      | X   | X   |

X: Don't Care

|         | /CE1 | /WE | /OE | A0 | A1 | A2 | Other Add |
|---------|------|-----|-----|----|----|----|-----------|
| REFALL  | L    | H   | L   | X  | X  | 1  | 1         |
| REFBNK0 | L    | H   | L   | 0  | 0  | 0  | 1         |
| REFBNK1 | L    | H   | L   | 1  | 0  | 0  | 1         |
| REFBNK2 | L    | H   | L   | 0  | 1  | 0  | 1         |
| REFBNK3 | L    | H   | L   | 1  | 1  | 0  | 1         |

SEMICONDUCTOR MEMORY DEVICE AND MEMORY SYSTEM

This application is a divisional of U.S. patent application Ser. No. 11/024,737, filed Dec. 30, 2004 now U.S. Pat. No. 7,102,949, which is based upon and claims the benefit of priority from Japanese Patent Application No. 2004-152301 filed on May 21, 2004 and Japanese Patent Application No. 2004-152302 filed on May 21, 2004. The entire contents of these applications are incorporated herein by reference.

CROSS-REFERENCE TO RELATED APPLICATIONS

This application is based upon and claims the benefit of priority from the prior Japanese Patent Applications No. 2004-152301, filed on May 21, 2004, and No. 2004-152302, filed on May 21, 2004, the entire contents of which are incorporated herein by reference.

BACKGROUND OF THE INVENTION

1. Field of the Invention

The present invention relates to a semiconductor memory device and a memory system, which are particularly preferable for use in a pseudo-SRAM (Static Random Access Memory).

2. Description of the Related Art

A pseudo-SRAM which is one of semiconductor memory devices is a memory of which memory cells for storing data are constituted of the same cells as those of a DRAM (Dynamic Random Access Memory), and of which external interface has compatibility with a SRAM. The pseudo-SRAM has the characteristics of the DRAM of having larger capacity at lower bit cost as compared with the SRAM, and has equal usability to the SRAM, and thus realizes an increase in capacity and facilitation of system design. For example, a low-power (low power consumption) pseudo-SRAM is used as a memory (RAM) for a cellular phone.

FIG. 1 is a block diagram showing a constitution of a conventional pseudo-SRAM 101. The pseudo-SRAM 101 has a memory cell array 102, an array control circuit 103, a refresh control circuit 104, a chip control circuit 105, an address decoder 106, a data signal control circuit 107 and an interface circuit 108.

The memory cell array 102 is constituted of a plurality of memory cells disposed in an array form with respect to a row direction and a column direction. Each memory cell is a 1T-1C type (one transistor and one capacitor type) memory cell as in the DRAM as described above. The array control circuit 103 performs a data read operation, a data write operation and a refresh operation for the memory cells in the memory cell array 102.

The refresh control circuit 104 outputs a request for a refresh operation for holding the data stored in the memory cells in accordance with a timer value included inside.

The chip control circuit 105 decodes a command (external command) CMD from an outside, which is supplied via the interface circuit 108, and outputs a control signal based on the decoded result and the refresh request from the refresh control circuit 104 to the array control signal 103. The command CMD is constituted of a chip enable signal /CE, an address valid signal /ADV, an output enable signal /OE and a write enable signal /WE ("/" which is affixed to the reference symbol of each signal indicates that the signal is of negative logic).

The chip control circuit 105 performs arbitration (arbitration processing) of the access request (data read/write) by the command CMD and the refresh request. In this arbitration, the request precedently generated is processed in preference.

The address decoder 106 decodes an address signal ADD from an outside, which is supplied via the interface circuit 108, and outputs the decoded result to the array control circuit 103.

The data signal control circuit 107 controls transmission and reception of data signals between the inside and the outside of the memory in the read operations and the write operations performed in accordance with the external commands.

A clock signal CLK, which synchronizes the input and output timings of the command CMD and a data signal DQ, is inputted into the interface circuit 108 from an outside, and is supplied to each functional section in the pseudo-SRAM 101.

FIG. 2 is a timing chart explaining the operation (data read operation) in the conventional pseudo-SRAM. In FIG. 2, a "core operation" is a selection operation for the memory cell array 102, in other words, the operation executed for the memory cell array 102 by the array control circuit 103. A "Peri operation" is the operation of peripheral circuits of the memory cell array 102 (array control circuit 103) such as the chip control circuit 105 and the data signal control circuit 107.

First, at a time T51, the chip enable signal /CE which brings the device (pseudo-SRAM) into an operational state, the address valid signal /ADV indicating that the address signal ADD is valid, and the output enable signal /OE change to "L". The chip control circuit 105 decodes this command CMD and determines that the access request from the outside is the data read operation RD (A). The address decoder 106 takes in the address signal ADD and decodes it.

However, if the refresh request from the refresh control circuit 104 generates before the time T51 when the access request from the outside is received, the refresh operation REF is executed in the memory cell array 102 (time T52). From a time T53 when the refresh operation REF is finished, the data read operation RD (A) is executed in the memory cell array 102, and data (1A), (2A) and (3A) of the memory cells corresponding to the decoded result in the address decoder 106 are sequentially read and outputted as the data signal DQ.

When the chip enable signal /CE changes to "H" at a time T54, the chip control circuit 105 instructs termination of the data read operation RD (A) to the array control circuit 103. By this, the data read operation RD (A) executed in the memory cell array 102 is finished (time T55).

When the chip enable signal /CE and the address valid signal /ADV change to "L" at the time T55, the chip control circuit 105 decodes the command CMD at this time, and determines that the access request from the outside is a data read operation RD (B). The address decoder 106 takes in the address signal ADD and decodes it.

At a time T56 when a refresh entry term TREN elapses from the time T55, the data read operation RD (B) is executed in the memory cell array 102, and data (1B), (2B), (3B), (4B) and (5B) are outputted as the data signal DQ. The refresh entry term TREN is always set between the data read/write operation according to the access request from the outside so that the refresh operation can be executed in the memory cell array 102 when the refresh request generates.

Thereafter, as in the data read operation RD (A), the chip enable signal /CE changes to "H" at a time T57, and thereby the data read operation RD (B) executed in the memory cell array 102 is finished (time T58).

FIG. 3 is a timing chart explaining an operation (data write operation) in the conventional pseudo-SRAM. The data write operation shown in FIG. 3 differs from the data read operation shown in FIG. 2 only in the respects that the write enable signal /WE is made "L" and the output enable signal /OE is kept at "H" and that the data (1A) to (3A) and (1B) to (5B) supplied as the data signal DQ are written into the memory cells, and in the other respects, it is the same as the data read operation shown in FIG. 2 (times T61 to T68 correspond to the times T51 to T58 respectively). Therefore, the explanation of the data write operation will be omitted.

As shown in FIGS. 2 and 3, the data read operation, the data write operation and the like are performed in the conventional pseudo-SRAM.

In recent years, a large-capacity and real time data communication related to video data and the like comes to be performed, and the operation at higher speed is demanded of the pseudo-SRAM which is used as the memory of a data communication apparatus including a cellular phone or the like.

[Patent Document 1] Japanese Patent Application Laid-open No. Hei 11-16346

[Patent Document 2] International Publication No. WO 98/56004

However, in the conventional pseudo-SRAM, the refresh entry term TREN is always provided as shown in FIGS. 2 and 3, and therefore, the access time related to the access request from the outside is specified so as to include the latency on the assumption of the case in which the refresh request precedently occurs, which is the worst case. A series of operations from reception of the access request (command) from the outside to input and output of the data is executed so that the series of operations corresponding to the next access request is started after a series of operations corresponding to an access request, namely, only the processing according to one access request is always performed.

As a method for enhancing the speed of the operation (access) in the pseudo-SRAM, the method of decreasing the access time from the outside by shortening the latency as shown in FIG. 4A can be considered. However, if the latency is shortened, a time interval TC between the data read/write operations by the access request from the outside is shortened, and there arises the fear that the term corresponding to the refresh entry term TREN cannot be ensured. Namely, when the latency is shortened, the refresh operation cannot be executed between the data read/write operations by the access request from the outside if the refresh request occurs, and there arises the fear that the data stored in the memory cells disappear.

As another method for enhancing the speed of the operation in the pseudo-SRAM, the method of multiplexing the access requests from the outside as shown in FIG. 4B is considered. However, if the data read operation RD (B) is requested when the data read operation RD (A) is being executed as shown in a time T91 in FIG. 4B, the address signal ADD related to the data read operation RD (B) is taken in and decoded at this point of time. Therefore, the decoded result in the address decoder 106 changes, and different memory cells are selected. Accordingly, when the data read operation RD (B) is requested during execution of the data read operation RD (A), the access request from the outside cannot be recognized accurately, and it cannot be guaranteed that accurate data is outputted from this point of time (data (3A) in the example shown in FIG. 4B). The same is equally true of the data write operation.

SUMMARY OF THE INVENTION

It is an object of the present invention to realize speeding up of an access operation to a semiconductor memory device.

A semiconductor memory device of the present invention has a memory cell array having a plurality of memory cells, a refresh request circuit requesting a refresh operation relating to the memory cell array, a processing circuit decoding information relating to an external access request to the memory cell array, supplied from an outside, and instructing an operation to be executed in the memory cell array in accordance with the decoded result and a refresh request, an array control circuit executing an operation for the memory cell array based on the instruction, and a register holding the decoded result of the information relating to the external access request.

According to the above-described constitution, even if an external access request is received when the operation corresponding to another external access request is executed in the memory cell array by the array control circuit, the information relating to the received external access request is decoded in the processing circuit independently from and in parallel with the processing by the array control circuit, and the result of it is held in the register, whereby the access requests from the outside can be multiplexed, and the pipelined operation by the processing circuit and the array control circuit can be realized. When subsequently to the operation corresponding to the first external access request, the execution of the operation corresponding to the second external access request inputted in multiple is instructed, the generated refresh request is kept on standby, whereby the operations corresponding to the external access requests can be sequentially performed without providing a refresh entry term, and speeding up of the access operation can be realized without causing any problem.

The semiconductor memory device of the present invention has a memory cell array with a plurality of memory cells disposed therein, a refresh request circuit outputting to an outside a refresh request signal requesting a refresh operation, a processing circuit decoding information relating to an external access request to the memory cell array, and instructing an operation to be executed in the memory cell array based on a decoded result, and an array control circuit executing an operation for the memory cell array based on an instruction from the processing circuit. The external access request includes a refresh execution request being a response to the refresh request signal.

According to the above-described constitution, the operations for the memory cell array, including the refresh operation, are requested by only the external access requests. Therefore, it is not necessary to provide a refresh entry term, and the time required for the access operation to the memory cell array such as latency and write cycle time can be shortened. When the register holding the decoded result of the information related to the external access request by the processing circuit is provided, the operation relating to the external access request can be executed by the pipelined operation by the processing circuit and the array control circuit.

BRIEF DESCRIPTION OF THE DRAWINGS

FIG. 7 is a diagram showing a circuit constitution example of a pipeline execution control section;

FIG. 8 is a diagram showing a constitution example of a command execution control section;

FIG. 9 is a diagram showing a circuit constitution example of a register;

FIG. 10 is a diagram showing a constitution example of an array control circuit;

FIGS. 17A and 17B are diagrams showing command examples of the semiconductor memory device according to the second embodiment;

DETAILED DESCRIPTION OF THE PREFERRED EMBODIMENTS

Hereinafter, embodiments of the present invention will be explained based on the drawings.

First Embodiment

Figure 1:
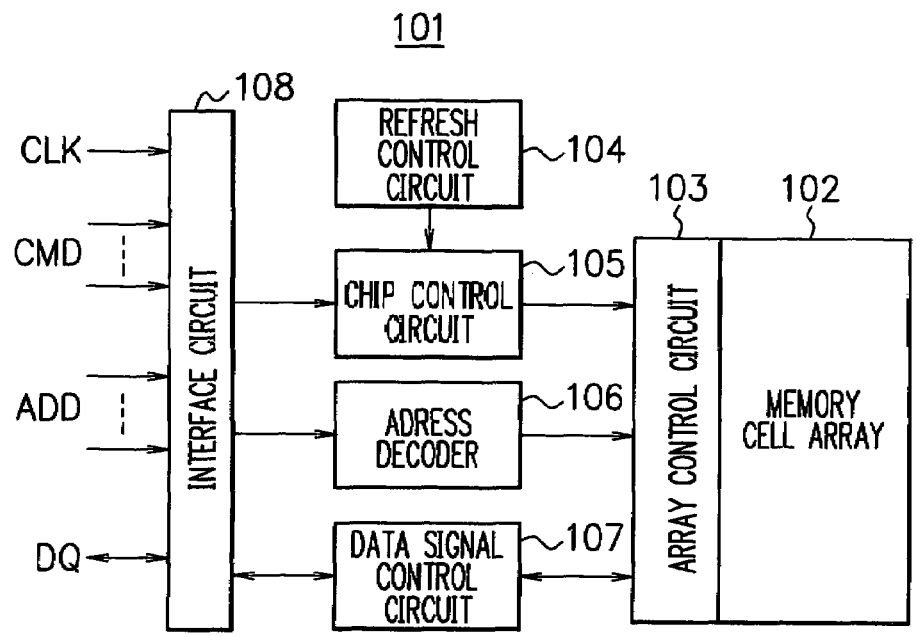
FIG. 1 is a block diagram showing a constitution of a conventional pseudo-SRAM.
Figure 2:
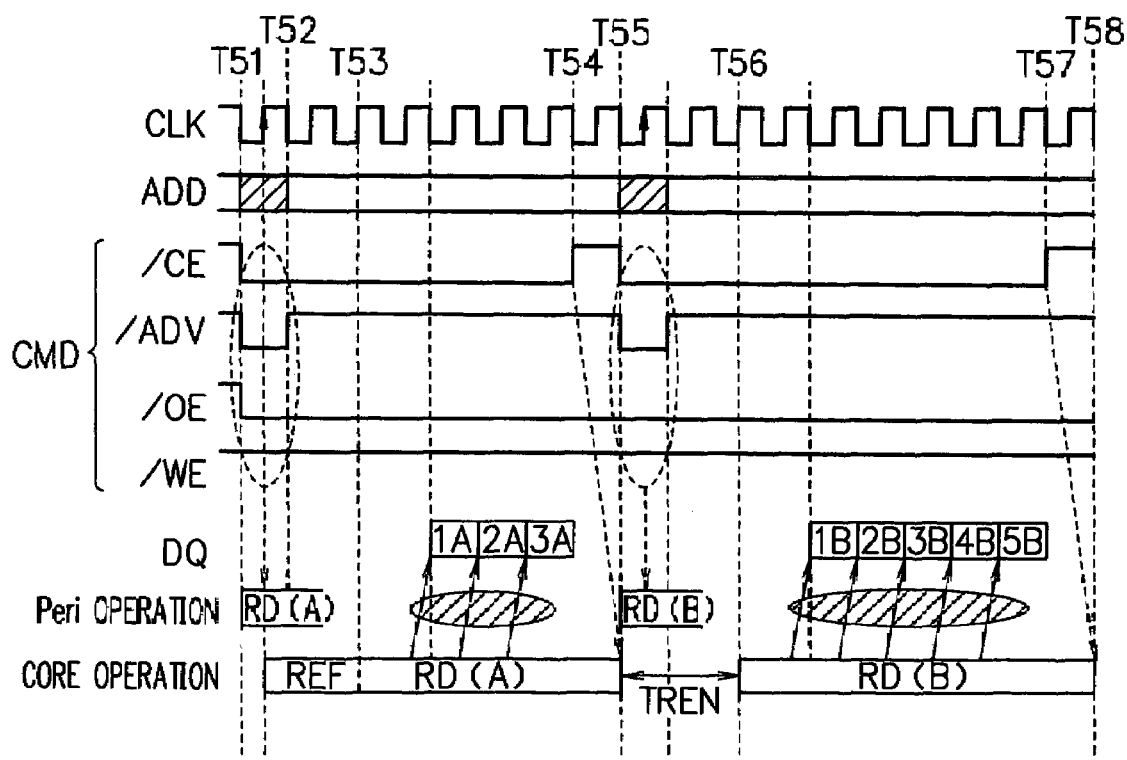
FIG. 2 is a timing chart showing a data read operation of the conventional pseudo-SRAM.
Figure 3:
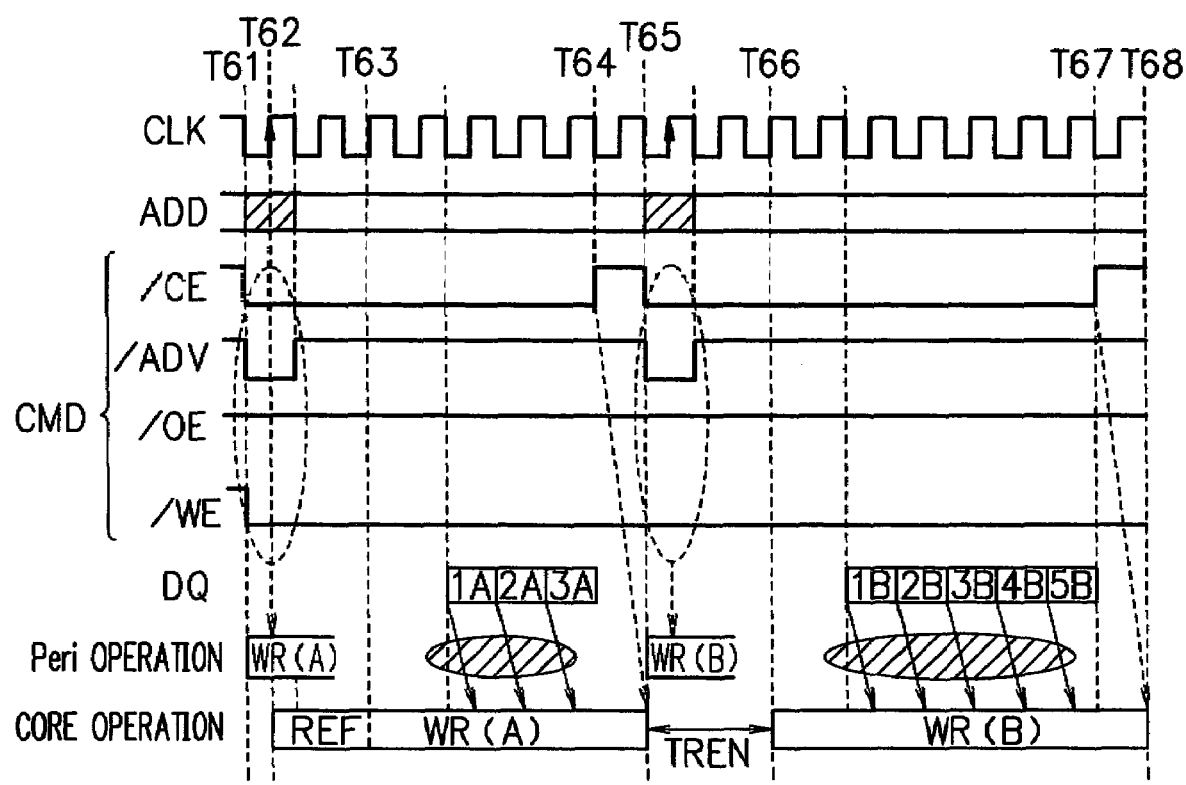
FIG. 3 is a timing chart showing a data write operation of the conventional pseudo-SRAM.
Figure 4A:
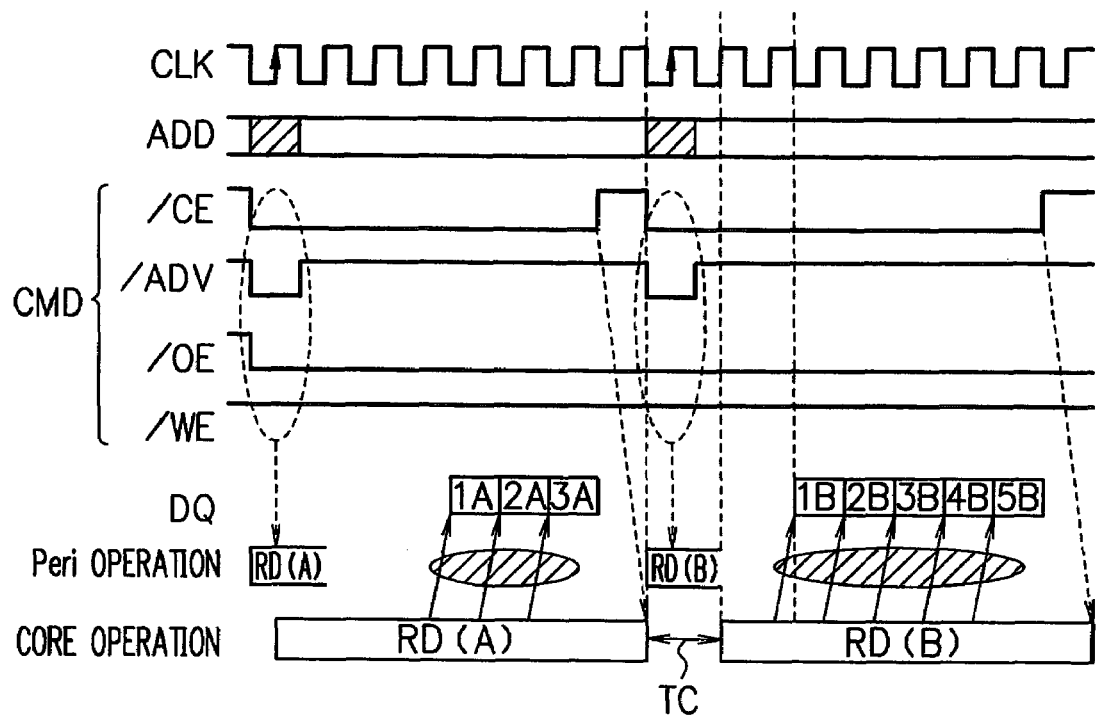
FIGS. 4A and 4B are diagrams for explaining problems in a pseudo-SRAM.
Figure 4B:
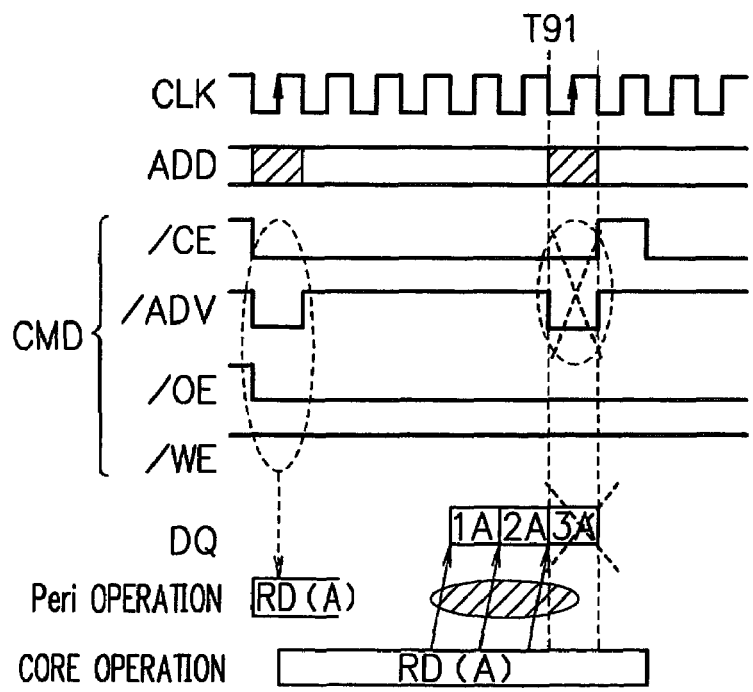
Figure 5:
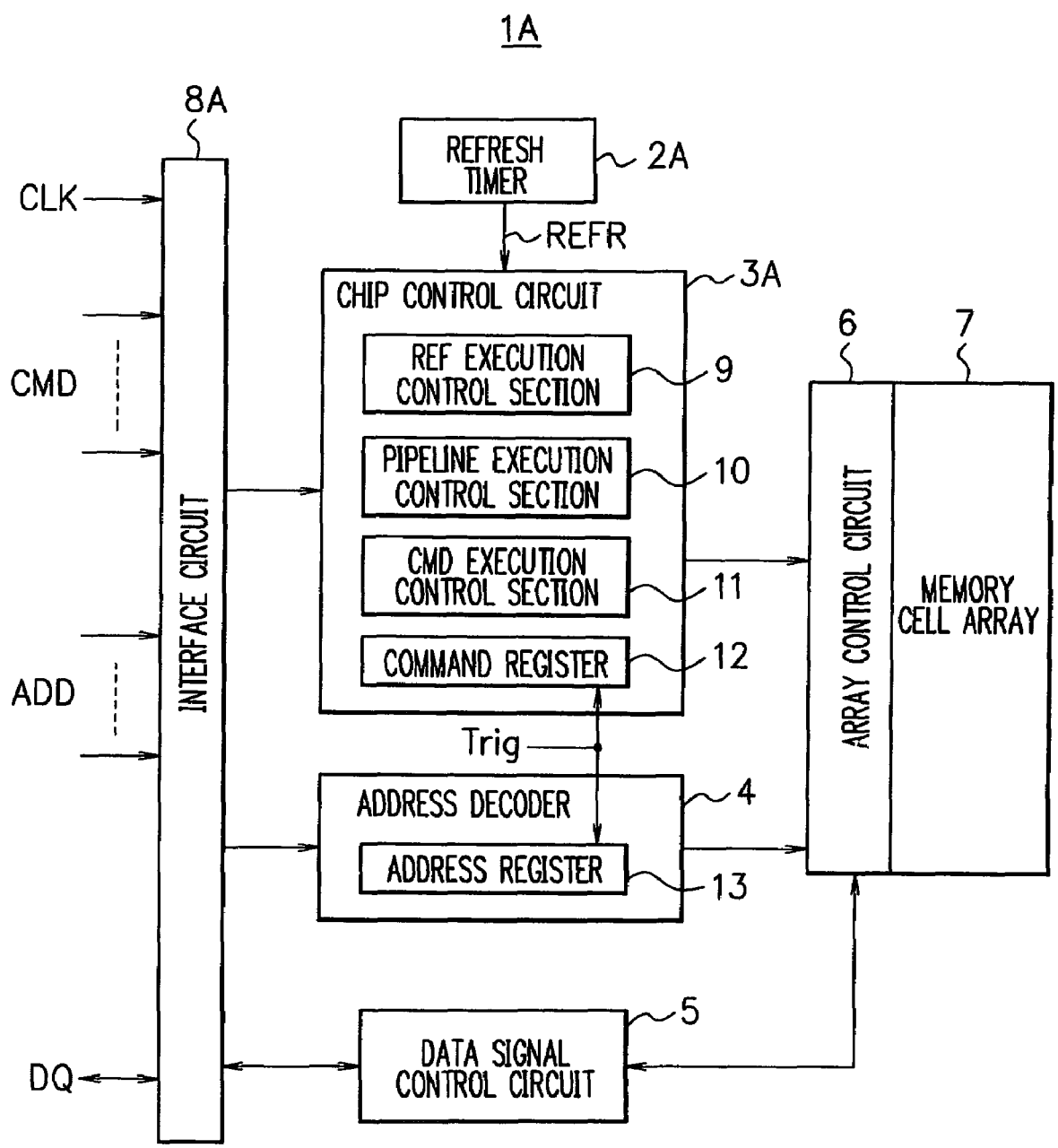
FIG. 5 is a diagram showing a constitution example of a semiconductor memory device according to a first embodiment of the present invention.

FIG. 5 is a block diagram showing a constitution example of a semiconductor memory device 1A according to a first embodiment of the present invention.

The semiconductor memory device 1A is a pseudo-SRAM, and has a refresh timer 2A, a chip control circuit 3A, an address decoder 4, a data signal control circuit 5, an array control circuit 6, a memory cell array 7 and an interface circuit 8A.

The refresh timer 2A clocks time by using a clocking device such as a counter, and outputs a refresh request signal REFR to the chip control circuit 3A each time a predetermined time period elapses. The refresh timer 2A corresponds to a refresh request circuit in the present invention. The refresh request signal REFR is a signal requesting a refresh operation for holding data stored in each memory cell in the memory cell array 7.

The chip control circuit 3A has a refresh (REF) execution control section 9, a pipeline execution control section 10, a command (CMD) execution control section 11 and a command register 12. The chip control circuit 3A performs centralized control of the operation of each circuit in the semiconductor memory device 1A.

More specifically, the chip control circuit 3A has a decoder not shown, and is supplied with a command (external command) CMD from an outside via the interface circuit 8A and decodes it. Subsequently, the chip control circuit 3A outputs a control signal to the array control circuit 6 based on the decoded result of the command CMD and the refresh request signal REFR from the refresh timer 2A. The chip control circuit 3A performs arbitration (arbitration processing) of an access request related to data read/write by the external command CMD and a refresh request by the refresh request signal REFR.

The command register 12 is a register holding the decoded result which is obtained by decoding the supplied command CMD from the outside in the chip control circuit 3A.

The refresh execution control section 9, the pipeline execution control section 10 and the command execution control section 11 will be described later.

The address decoder 4 decodes an address signal ADD from the outside, which is supplied via the interface circuit 8A, and outputs a selection address signal based on the decoded result to the array control circuit 6. The address decoder 4 has an address register 13 holding the decoded result which is obtained by decoding the address signal ADD. The decoded results respectively held in the address register 13 and the command register 12 relate to the same access request from the outside. The decoded results held in the command register 12 and the address register 13 are synchronously outputted based on a trigger signal Trig.

A processing circuit in the present invention is constituted of the chip control circuit 3A and the address decoder 4.

The data signal control circuit 5 controls transmission and reception of a data signal DQ between the inside and the outside of the semiconductor memory device 1A via the interface circuit 8A in the read operation and the write operation for the memory cell array 7 which are performed in accordance with the command CMD from the outside.

The array control circuit 6 executes the data read operation, the data write operation and the refresh operation relating to the memory cells in the memory cell array 7 based on the control signal supplied from the chip control circuit 3A and the selection address signal supplied from the address decoder 4.

The memory cell array 7 has a plurality of memory cells disposed in an array form with respect to a row direction and a column direction. More specifically, the memory cell array 7 has a plurality of bit lines and a plurality of word lines provided to intersect the bit lines, and memory cells are disposed at the intersecting portions of the bit lines and the word lines. Each memory cell is constituted of a 1T-1C type (one transistor and one capacitor type) memory cell as in the DRAM, and stores one-bit data.

The memory cell array 7 has sense amplifiers provided corresponding to the bit lines.

The interface circuit 8A is a circuit for transmitting and receiving each signal between the inside and the outside of the semiconductor memory device 1A. The command CMD and the address signal ADD are inputted into the interface circuit 8A from the outside, and the data signal DQ is inputted into and outputted from the interface circuit 8A from and to the outside. A clock signal CLK for synchronizing the input and output timings of the command CMD and the data signal DQ is inputted into the interface circuit 8A from the outside, and is supplied to each circuit in the semiconductor memory device 1A.

Figure 6A:
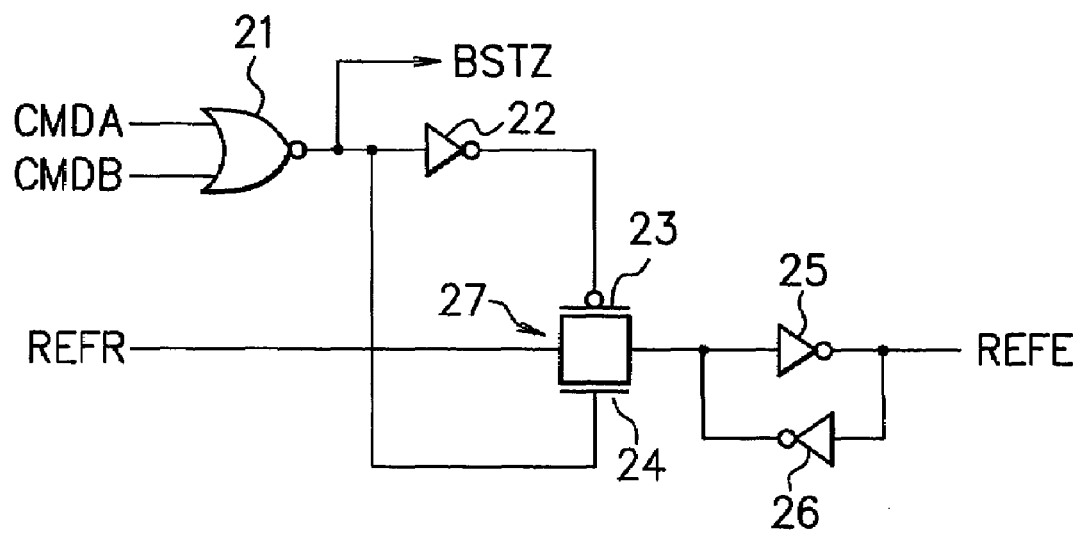
FIG. 6A is a diagram showing a circuit constitution example of a refresh execution control section.

FIG. 6A is a circuit diagram showing a constitution of a refresh execution control section 9 shown in FIG. 5.

The refresh execution control section 9 has an NOR (negative logical sum operation) circuit 21, inverters 22, 25 and 26, and a transfer gate 27 constituted of a P-channel transistor 23 and an N-channel transistor 24.

External access request signals CMDA and CMDB are inputted into the NOR circuit 21. The output of the NOR circuit 21 is supplied to a control terminal (gate) of the transistor 23 via the inverter 22, and is supplied to a control terminal (gate) of the transistor 24. The output of the NOR circuit 21 is outputted as an access termination signal BSTZ. Here, each external access request signals CMDA and CMDB is the signal which is high-level ("H") when the command CMD is inputted and a command (access request from the outside) is present. The external access request signal CMDA corresponds to an ordinary command independently inputted and a precedent command in a pipelined operation (described later) which is the feature of this embodiment, and the external access request signal CMDB corresponds to a command following the precedent command.

The refresh request signal REFR from the refresh timer 2A is capable of being inputted into the inverter 25 via the transfer gate 27, and the output of the inverter 25 is outputted as the refresh execution instruction REFE. The inverters 25 and 26 have their input terminals connected to the output terminals of the different inverters from themselves, and a latch (holding) circuit is constituted by the inverters 25 and 26.

Figure 6B:
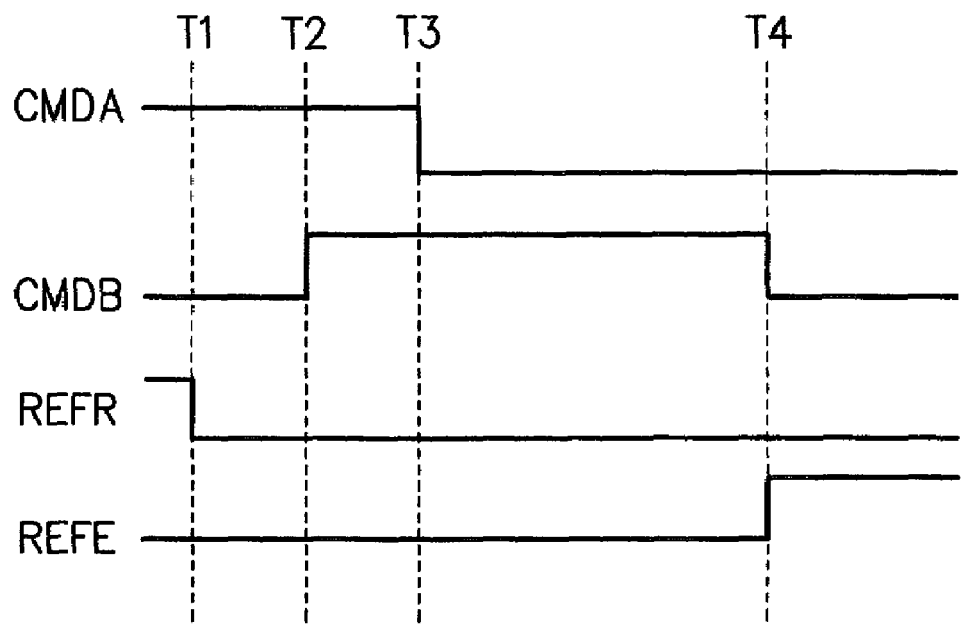
FIG. 6B is a timing chart showing an operation of the refresh execution control section shown in FIG. 6A.

FIG. 6B is a timing chart showing an operation of the refresh execution control section 9 shown in FIG. 6A. In the following explanation, it is assumed that the refresh request signal REFR requests a refresh operation when it is low-level ("L"), and the refresh execution instruction REFE instructs execution of the refresh operation when it is "H".

First of all, both of the external access request signal CMDA and the refresh request signal REFR are "H", the external access request signal CMDB is "L", and as a result, the refresh execution instruction REFE is "L".

From this state, the refresh request signal REFR changes to "L" at a time T1, and the external access request signal CMDB changes to "H" at a time T2. The external access request signal CMDA changes to "L" at a time T3, and the external access request signal CMDB changes to "L" at a time T4.

When each of the signals changes as described above, at least one of the external access request signals CMDA and CMDB is "H" until the time T4. Therefore, the transfer gate 27 keeps an OFF state and the refresh request signal REFR is not inputted into the inverter 25. Accordingly, the refresh execution instruction REFE keeps "L".

Then, both the external access request signals CMDA and CMDB become "L" at the time T4, whereby the transfer gate 27 is brought into an ON state, and the refresh request signal REFR is inputted into the inverter 25 via the transfer gate 27. As a result, the refresh execution instruction REFE changes to "H", and the execution of the refresh operation is instructed.

As described above, the refresh execution control section 9 prevents the refresh request signal REFR from being transmitted when at least one of the external access request signals CMDA and CMDB is "H", namely, at least one command is present, and restrains the refresh operation from being executed (keeps the refresh operation on standby).

FIG. 7 is a circuit diagram showing a constitution of the pipeline execution control section 10 shown in FIG. 5.

The pipeline execution control section 10 has NAND (negative logical product operation) circuits 31, 32, 33 and 38, an NOR circuit 39, inverters 30, 36 and 37, and a transfer gate 40 constituted of a P-channel transistor 34 and an N-channel transistor 35. In FIG. 7, CMDA is a precedent command and CMDB(P) is a command relating to the pipelined operation following the precedent command, and CE and /CE are each a chip enable signal, which is one of the command signals ("/" indicates the negative logical signal. The same will also apply to the following description.).

The command CMDB (P) relating to the pipelined operation and the chip enable signal CE are inputted into the NAND circuit 31, and the output of the NAND circuit 31 is inputted into the NAND circuit 32. The output of the NAND circuit 33 is inputted into the NAND circuit 32. The outputs of the NAND circuits 32 and 38 are inputted into the NAND circuit 33. Namely, the NAND circuits 32 and 33 constitute an RS flip-flop.

The output of the NAND circuit 32 is capable of being inputted into the inverter 36 via the transfer gate 40 which is controlled according to the chip enable signals CE and /CE. The inverters 36 and 37 have their input terminals connected to the output terminals of the different inverters from themselves, and constitute a latch circuit.

The output of the inverter 36 is inputted into the inverter 30, the output of the inverter 30 and the chip enable signal CE are inputted into the NAND circuit 38, and the output of the NAND circuit 38 is inputted into the NOR circuit 39. The command CMDA is inputted into the NOR circuit 39, and the output of the NOR circuit 39 is outputted as an execution command CMDE.

When the command CMDB instructing to perform a pipelined operation is inputted during execution of the precedent command CMDA (at this time, the chip enable signal CE is "H" (/CE is "L") in the pipeline execution control section 10 shown in FIG. 7, the command CMDB is latched in the RS flip-flop constituted of the NAND circuits 32 and 33 via the NAND circuit 31.

Thereafter, when the chip enable signal CE changes to "L" (/CE changes to "H") to stop (terminate) the operation relating to the precedent command CMDA, the command CMDB is transferred to the latch constituted of the inverters 36 and 37 via the transfer gate 40. When the chip enable signal CE changes to "H" again, the command CMDB is outputted as the execution command CMDE via the NAND circuit 38 and the NOR circuit 39.

FIG. 8 is a block diagram showing a constitution of the command execution control section 11 shown in FIG. 5.

The command execution control section 11 has a refresh (REF) determining part 41, a refresh (REF) holding part 42 and a command (CMD) generating part 43.

The command CMD (for example, the chip enable signal CE of the command CMD) and the refresh execution instruction REFE are inputted into the refresh determining part 41, and the refresh determining part 41 determines which request of the access (data read/write) request from the outside by the command CMD and the refresh request is given priority. Then, the refresh determining part 41 outputs the determination result to the refresh holding part 42. Namely, the refresh determining part 41 performs arbitration (arbitration processing) of the access request from the outside and the refresh request.

For example, the refresh determining part 41 is constituted of an RS flip-flop to which the command CMD and the refresh execution instruction REFE are inputted, and supplies the output of the RS flip-flop to the refresh holding part 42 as the determination result.

The refresh holding part 42 is supplied with the refresh execution instruction REFE and the determination result by the refresh determining part 41. The refresh holding part 42 holds the refresh request (refresh execution instruction REFE) if the refresh request is present when the determination result gives priority to the access request from the outside. The refresh holding part 42 restarts the refresh request which it holds based on the access termination signal BSTZ supplied from the refresh execution control section 9, and outputs a refresh trigger signal REFT to the command generating part 43.

The command generating part 43 generates and outputs a control signal (a circuit activating signal) in response to a request. The command generating part 43 generates a predetermined circuit activating signal and outputs it based on the supplied command CMD and the refresh trigger signal REFT on execution of the external access or refresh.

FIG. 9 is a circuit diagram showing a constitution of a register circuit 51 which constitutes each of the command register 12 and the address register 13 shown in FIG. 5. The command register 12 and the address register 13 are each constituted by using a predetermined number of register circuits 51 shown in FIG. 9 according to necessity.

The register circuit 51 has inverters 52, 55 and 56, and a transfer gate 57 constituted of a P-channel transistor 53 and an N-channel transistor 54.

In the register circuit 51, the clock signal CLK is supplied to a control terminal (gate) of the transistor 53 via the inverter 52, and supplied to a control terminal (gate) of the transistor 54. An input signal IN is capable of being inputted into the inverter 55 via the transfer gate 57, and the output of the inverter 55 is outputted as an output signal OUT. The inverters 55 and 56 have their input terminals and output terminals connected to each other, and constitute a latch circuit.

FIG. 10 is a block diagram showing a constitution of the array control circuit 6 shown in FIG. 5, and the array control circuit 6 has each of the circuits 61 to 71 except for the memory cell array 7 shown in FIG. 10.

In FIG. 10, a block selection instruction circuit 61, a word line (WL) selection instruction circuit 62, a sense amplifier (SA) selection instruction circuit 63, a column line (CL) selection instruction circuit 64 and an amplifier (AMP) activation instruction circuit 65 respectively control the corresponding operation timings of a block selection circuit 66, a word line selection circuit 67, a sense amplifier activation circuit 68, a column line selection circuit 69 and an amplifier activation control circuit 70.

The block selection circuit 66 selectively activates a bit line transfer signal line BT and inactivates a precharge signal line BRS in accordance with a block selection address signal BLSA that is supplied from the address decoder 4. The word line selection circuit 67 selectively activates the word line WL corresponding to a word line selection address signal WLSA that is supplied from the address decoder 4. The sense amplifier activation circuit 68 activates a sense amplifier driving signal line LE. The column line selection circuit 69 selectively activates the column line CL corresponding to a column line selection address signal CLSA supplied from the address decoder 4. The amplifier activation control circuit 70 activates an amplifier driving signal line AEN for driving an amplifier 71. The amplifier 71 amplifies the data which is read from the memory cell array 7 and outputs the data to the data signal control circuit 5.

The operations of the respective circuits 66 to 70 activating the signal lines (including the selecting operation) are sequentially performed respectively based on the instructions from the corresponding instruction circuits 61 to 65.

More specifically, an instruction is outputted to the block selection circuit 66 from the block selection instruction circuit 61 first based on the control signal supplied from the chip control circuit 3A and the array selection address signal ARSA supplied from the address decoder 4. Subsequently, under the condition that the instruction from the block selection instruction circuit 61 is outputted, an instruction is outputted to the word line selection circuit 67 from the word line selection instruction circuit 62. Thereafter, instructions are sequentially outputted similarly from the sense amplifier selection instruction circuit 63 to the sense amplifier activation circuit 68, from the column line selection instruction circuit 64 to the column line selection circuit 69, and from the amplifier activation instruction circuit 65 to the amplifier activation control circuit 70. It should be noted that the instruction from the amplifier activation instruction circuit 65 to the amplifier activation control circuit 70 is outputted on the condition that the instructions are outputted from both the sense amplifier selection instruction circuit 63 and the column line selection instruction circuit 64.

Figure 11A:
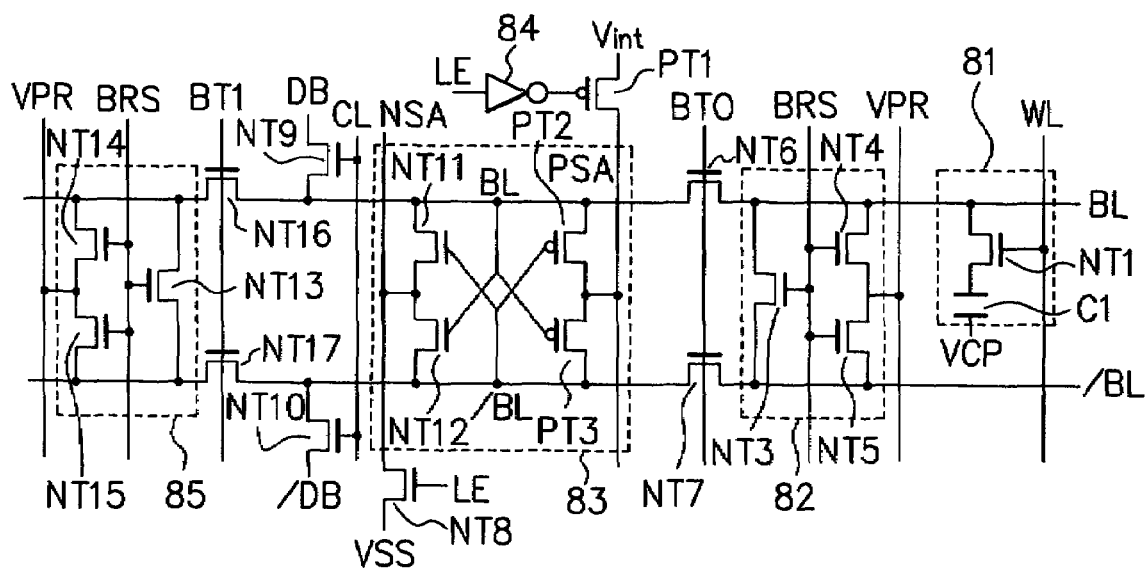
FIG. 11A is a diagram showing a circuit constitution example of a memory cell and its peripheral circuits in a memory cell array.
Figure 11B:
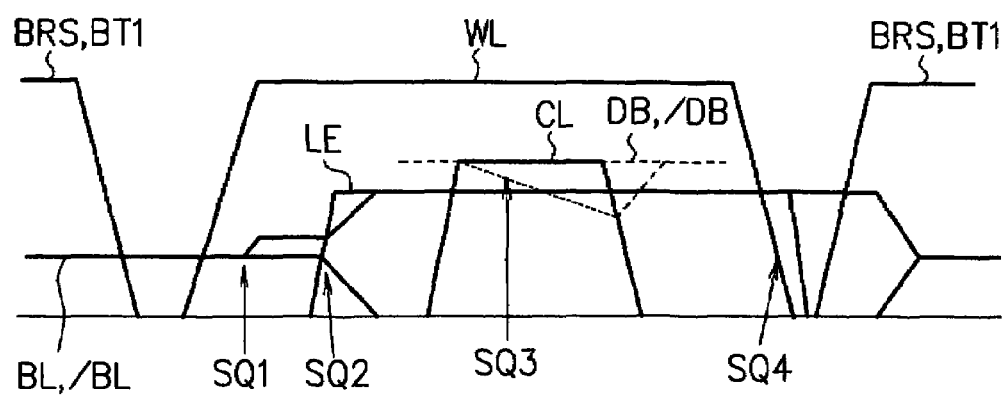
FIG. 11B is a diagram showing a data read sequence relating to the memory cell.

FIG. 11A is a circuit diagram showing a constitution of the memory cell array 7 shown in FIG. 5, and shows one memory cell and its peripheral circuits, in the memory cell array 7 constituted of a plurality of memory cells. FIG. 11B is a timing chart explaining the data read operation in the circuit shown in FIG. 11A.

In FIG. 11A, reference numeral and symbol C1 denotes a capacitor, reference numerals and symbols NT1 to NT17 denote N-channel transistors, and reference numerals and symbols PT1 to PT3 denote P-channel transistors. The capacitor C1 and the transistor NT1 constitute a memory cell (1T1C type memory cell). A group of the transistors NT3 to NT5 and a group of the transistors NT13 to NT15 respectively constitute precharge circuits 82 and 85. The transistors NT11, NT12, PT2 and PT3 constitute a sense amplifier 83. Reference numeral 84 denotes an inverter.

Information of one bit is stored in the capacitor C1 of a memory cell 81. An operation performed when the data stored in the memory cell 81 (capacitor C1) is read will be explained with reference to FIG. 11B.

When none of a data read operation, a data write operation and a refresh operation are executed, bit line transfer signal lines BT0 and BT1 and precharge signal lines BRS are activated, and are "H". Accordingly, the transistors NT3 to NT5 and NT13 to NT15 in the precharge circuits 82 and 85, and the transistors NT6, NT7, NT16 and NT 17 are conducting, and the potentials of the bit lines BL and /BL are equal potentials.

On reading the data, the bit line transfer signal line(s) (the bit line transfer signal line BT1 in the circuit shown in FIG. 11A) other than the bit line transfer signal line BT0 corresponding to the memory cell 81, and the precharge signal lines BRS are inactivated to make them "L". Accordingly, the precharge circuits 82 and 85 are in the non-operating state, and the transistors NT16 and NT17 are in the non-conduction state (release of the reset state of the sense amplifier 83). The bit line transfer signal line BT0 keeps "H".

Next, when a word line WL is selectively activated and becomes "H", the transistor NT1 is brought into conduction, and the data stored in the capacitor C1 is read out to the bit line BL. Thereby, the potential of the bit line BL changes in accordance with the data stored in the capacitor C1 (SQ1). Here, the transistors NT6 and NT7 are in the conduction state, and the transistors NT16 and NT17 are in the non-conduction state. Therefore, the data (potential) of the bit lines BL and /BL are supplied to the sense amplifier 83 via the transistors NT6 and NT7.

Next, when a sense amplifier drive signal line LE is activated and becomes "H", the transistors NT8 and PT1 are brought into conduction to perform power source supply, whereby the sense amplifier 83 is operated, and the data of the bit lines BL and /BL are amplified (SQ2). Subsequently, when a column line CL is selectively activated and becomes "H", the transistors NT9 and NT10 as column gates are brought into conduction, and the amplified data of the bit lines BL and /BL are outputted to the data buses DB and /DB (SQ3).

Thereafter, the column line CL is inactivated and is made "L", and after the read data are rewritten to the memory cell 81 (capacitor C1) (SQ4), the word line WL is inactivated and changed to "L". Further, after the sense amplifier 83 is brought into a non-operating state by inactivating the sense amplifier drive signal line LE and changing it to "L", all the bit line transfer signal lines BT0 and BT1 and precharge signal line BRS are activated and the data read operation is finished.

The data write operation to the memory cell 81 is the same as the conventional art, and the explanation of it will be omitted.

Next, a pipelined operation in the semiconductor memory device 1A according to the first embodiment will be explained.

Figure 12:
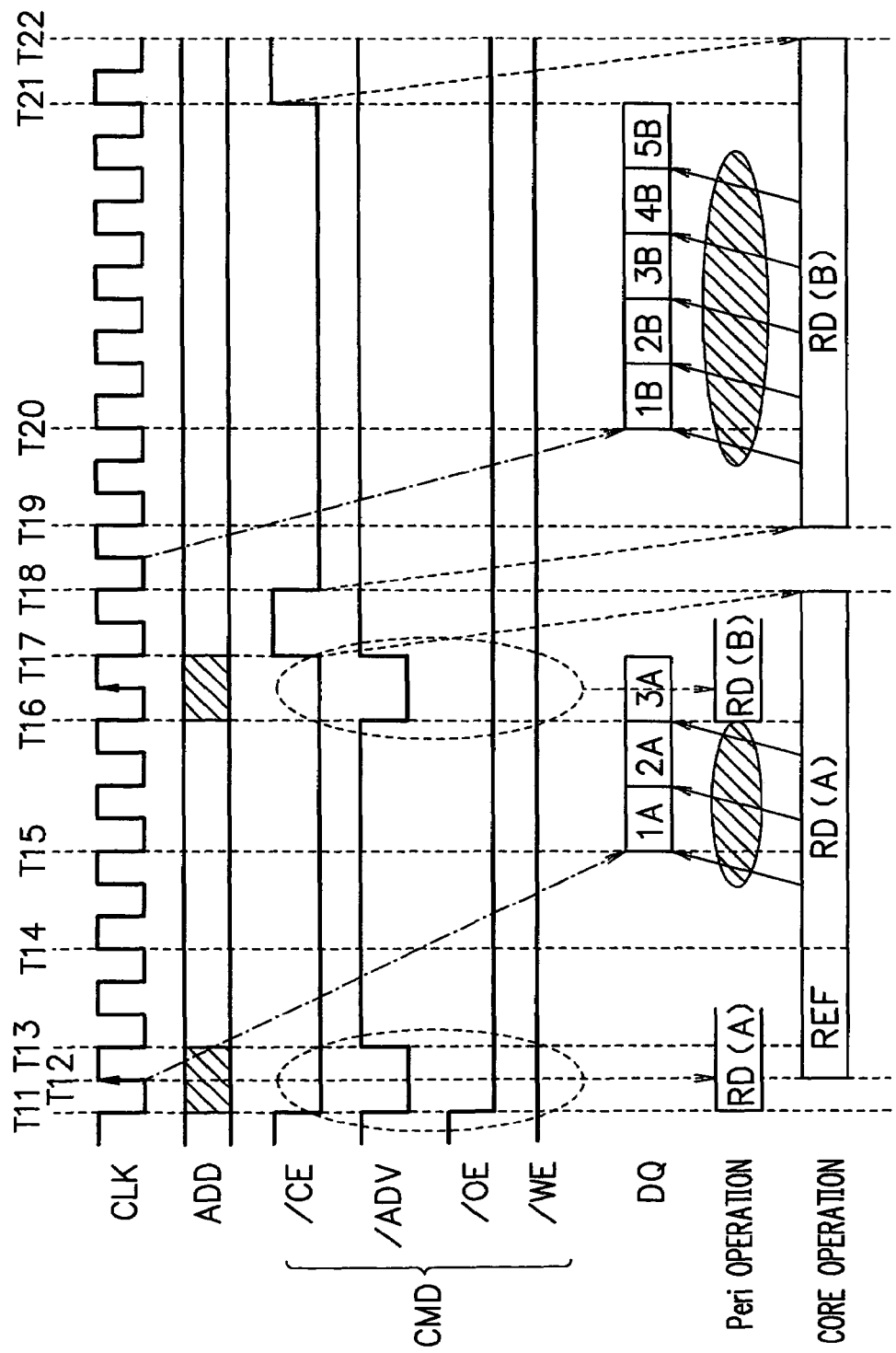
FIG. 12 is a timing chart showing an operation example of the semiconductor memory device according to the first embodiment.

FIG. 12 is a timing chart showing an operation example of the semiconductor memory device according to the first embodiment. The example shown in FIG. 12 shows the case of the semiconductor memory device which uses the chip enable signal /CE which brings the semiconductor memory device 1A into the operating state, the address valid signal /ADV indicating that the address signal ADD is valid, the output enable signal /OE and the write enable signal /WE as the command CMD. In FIG. 12, the "core operation" is a selection operation of the memory cell array 7 (the operation which the array control circuit 6 executes for the memory cell array 7), and the "Peri operation" is the operation which is executed by the circuits 2A, 3A, 4, 5 and 8A except for the array control circuit 6 and the memory cell array 7.

First, at a time T11, the chip enable signal /CE, the address valid signal /ADV and the output enable signal /OE change to "L". The chip control circuit 3A decodes this command CMD and determines that the access request from the outside is the data read operation RD (A). The address decoder 4 takes in the address signal ADD and decodes it.

Here, in the semiconductor memory device 1A according to the first embodiment, when the access request from the outside is not multiplexed, namely, when the access request from the outside is not the access request which is received during execution of the operation of another access request from the outside, arbitration is performed between the access request from the outside and the refresh request.

For example, when the refresh request occurs by the refresh request signal REFR from the refresh timer 2A before the time T11, the refresh core operation is executed in the memory cell array 7 (time T12).

Next, at a time T13, the address valid signal /ADV changes to "H".

When the refresh operation as the core operation is finished at a time T14, the data read operation RD (A) for the memory cell array 7 is executed. Thus, after a time T15, the data (1A), (2A) and (3A) of the memory cells corresponding to the decoded result in the address decoder 4 are sequentially read and outputted as the data signal DQ.

When the address valid signal /ADV changes to "L" at a time T16 when the data read operation RD (A) is being executed for the memory cell array 7, the chip control circuit 3A decodes the command CMD and determines that the access request from the outside is the data read operation RD (B). The address decoder 4 takes in the address signal ADD and decodes it. At this time, the operation RD (A) by the other access request from the outside is being executed for the memory cell array 7, and therefore, the chip control circuit 3A and the address decoder 4 hold the respective decoded results relating to the data read operations RD (B) in the command register 12 and the address register 13.

Next, at a time T17, the address valid signal /ADV and the chip enable signal /CE change to "H". As a result that the chip enable signal /CE changes to "H", the chip control circuit 3A instructs termination of the data read operation RD (A) to the array control circuit 6, and thereby the data read operation RD (A) executed in the memory cell array 7 is finished (time T18). The command to terminate the operation by changing the chip enable signal /CE to "H" when a burst operation is performed in the data read operation and so on like this is called a termination command in this embodiment.

When the chip enable signal /CE changes to "L" again at the time T18, the execution of the data read operation RD (B) as the core operation is instructed by the pipeline execution control section 10 in the chip control circuit 3A. At a time T19, the execution of the data read operation RD (B) for the memory cell array 7 is started based on the decoded results held in the command register 12 and the address register 13.

Here, in the semiconductor memory device 1A according to the first embodiment, in the case in which the external access request is multiplexed, namely, is an access request which is received during execution of the operation of another access request from the outside, the operation of the multiplexed access request is executed without performing arbitration between the access request and the refresh request, after the operation of the other access request from the outside is finished. This is realized by the refresh execution control section 9 and the like in the chip control circuit 3A.

From a time T20, the data (1B), (2B), (3B), (4B) and (5B) of the memory cells corresponding to the decoded result held in the address register 13 are sequentially read and outputted as the data signal DQ.

Subsequently, at a time T21, the chip enable signal /CE changes to "H", namely, the termination command is issued, and thereby the data read operation RD (B) as the core operation is finished at the time T21.

Figure 13:
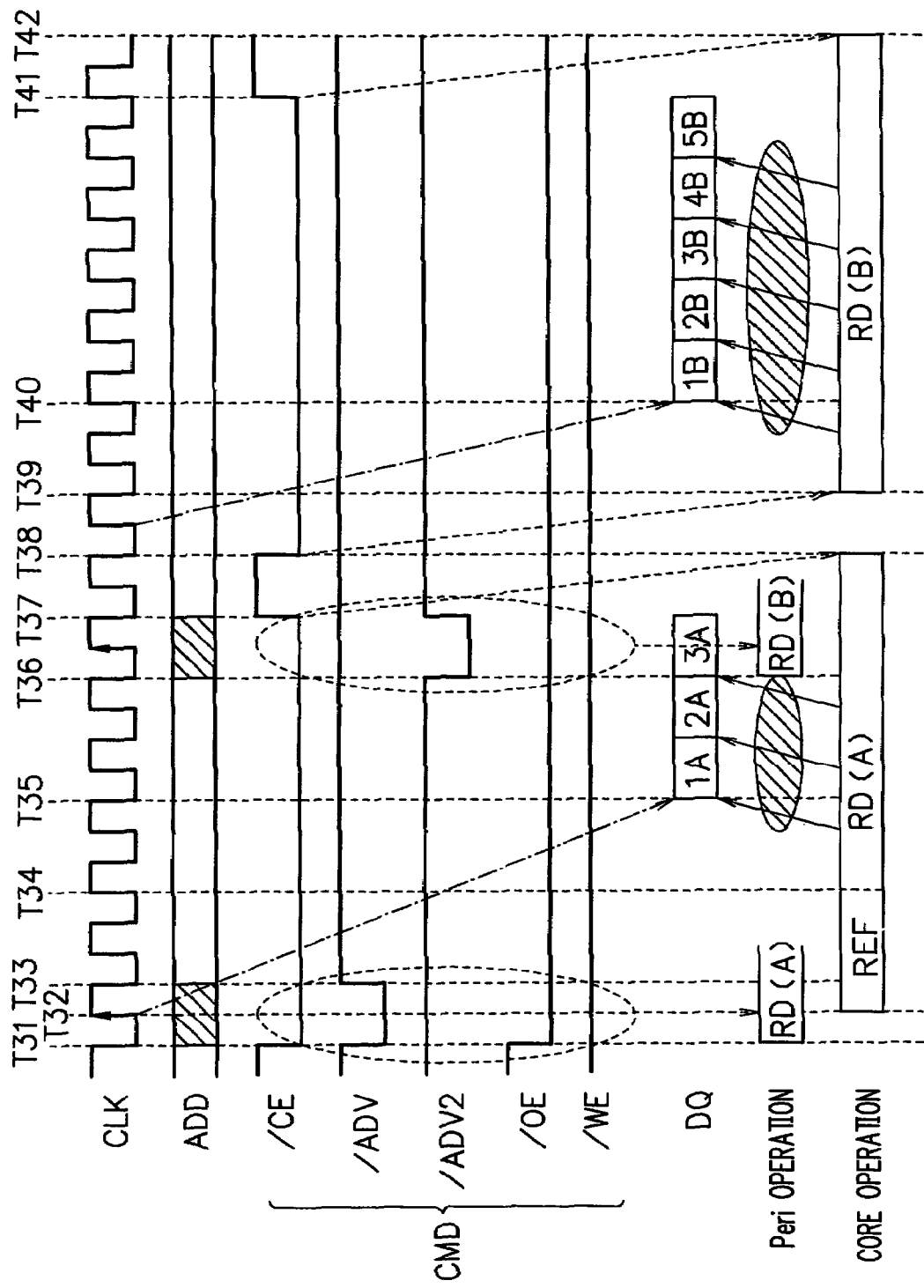
FIG. 13 is a timing chart showing an operation example of another semiconductor memory device according to the first embodiment.

FIG. 13 is a timing chart showing an operation example of another semiconductor memory device according to the first embodiment. The example shown in FIG. 13 shows the case of the semiconductor memory device which further uses another address valid signal /ADV2 in addition to the signals shown in FIG. 12, as the command CMD. Another address valid signal /ADV2 is a signal indicating that the address signal ADD is valid and the access request from the outside relates to the pipelined operation, namely, a multiplexed request.

As for FIG. 13, it differs from FIG. 12 only in the respect that instead of making the address valid signal /ADV "L" during the times T16 to T17 shown in FIG. 12, another address valid signal /ADV2 indicating that the access request from the outside relates to the pipelined operation is made "L" during the corresponding times T36 to T37, and the operation in the semiconductor memory device 1A is the same. Therefore, the detailed explanation will be omitted. The times T31 to T42 shown in FIG. 13 respectively correspond to the times T11 to T22 shown in FIG. 12.

According to the first embodiment, when an operation corresponding to an access request from the outside is being executed for the memory cell array 7 by the array control circuit 6, if another access request from the outside is received, the chip control circuit 3A decodes the command CMD and the address decoder 4 decodes the address signal ADD irrespective of the operation in the array control circuit 6. Then, the decoded results are held in the command register 12 and the address register 13. Thereafter, when the operation corresponding to the access request from the outside in the memory cell array 7 is finished, the operation corresponding to the other access request from the outside is executed in the memory cell array 7 based on the decoded results held in the command register 12 and the address register 13 without providing a refresh entry term.

Thereby, the processing from the reception of the access request from the outside to the decode of the access request (the pre-stage processing) and the processing for the memory cell array 7 based on the decoded results (subsequent stage processing) in the semiconductor memory device 1A can be executed independently in parallel by the pipelined operation. Namely, the pre-stage processing according to the access request A from the outside and the subsequent stage processing according to the access request B from the outside are performed in parallel, and after the subsequent stage processing according to the access request B from the outside is finished, the subsequent stage processing which is the processing of the next stage is performed for the access request A from the outside. Accordingly, the access request from the outside is inputted in multiple, and the pipelined operation can be realized for the operations relating to the access requests from the outside. In addition, the latency can be shortened by not providing the refresh entry term, and speeding up of the access operation can be realized without causing any problem in the semiconductor memory device 1A. The bus efficiency of the data signal DQ can be enhanced by realizing the pipelined operation.

In the first embodiment, the maximum number of access requests from the outside when the access requests from the outside are inputted in multiple and successively executed is not mentioned, but if only the previously specified time interval of the refresh operation is satisfied, the maximum number of access requests is optional. For example, when the data holding time of the memory cell is 100 msec, and the number of times by which the refresh operation is executed for all the cells in the memory cell array 7 is 8000 times, the time interval of the refresh operation is 100 msec/8000=12.5 μs. Therefore, within 12.5 μs, the access requests from the outside may be successively executed, and the data of each memory cell can be assured.

In the first embodiment, the latency in the core operation corresponding to the access request to be executed later is shortened by providing no refresh entry term when the access request from the outside is inputted in multiple, but as in the example shown in FIG. 13, by using the two address valid signals /ADV and /ADV2, the latency may be made the same as in the normal case with one signal and the latency may be shortened with the other signal, irrespective of whether the access request is inputted in multiple or not. In this manner, speeding up of the access operation can be also realized without causing any problem in the semiconductor memory device 1A.

Second Embodiment

Next, a second embodiment of the present invention will be explained.

Figure 14:
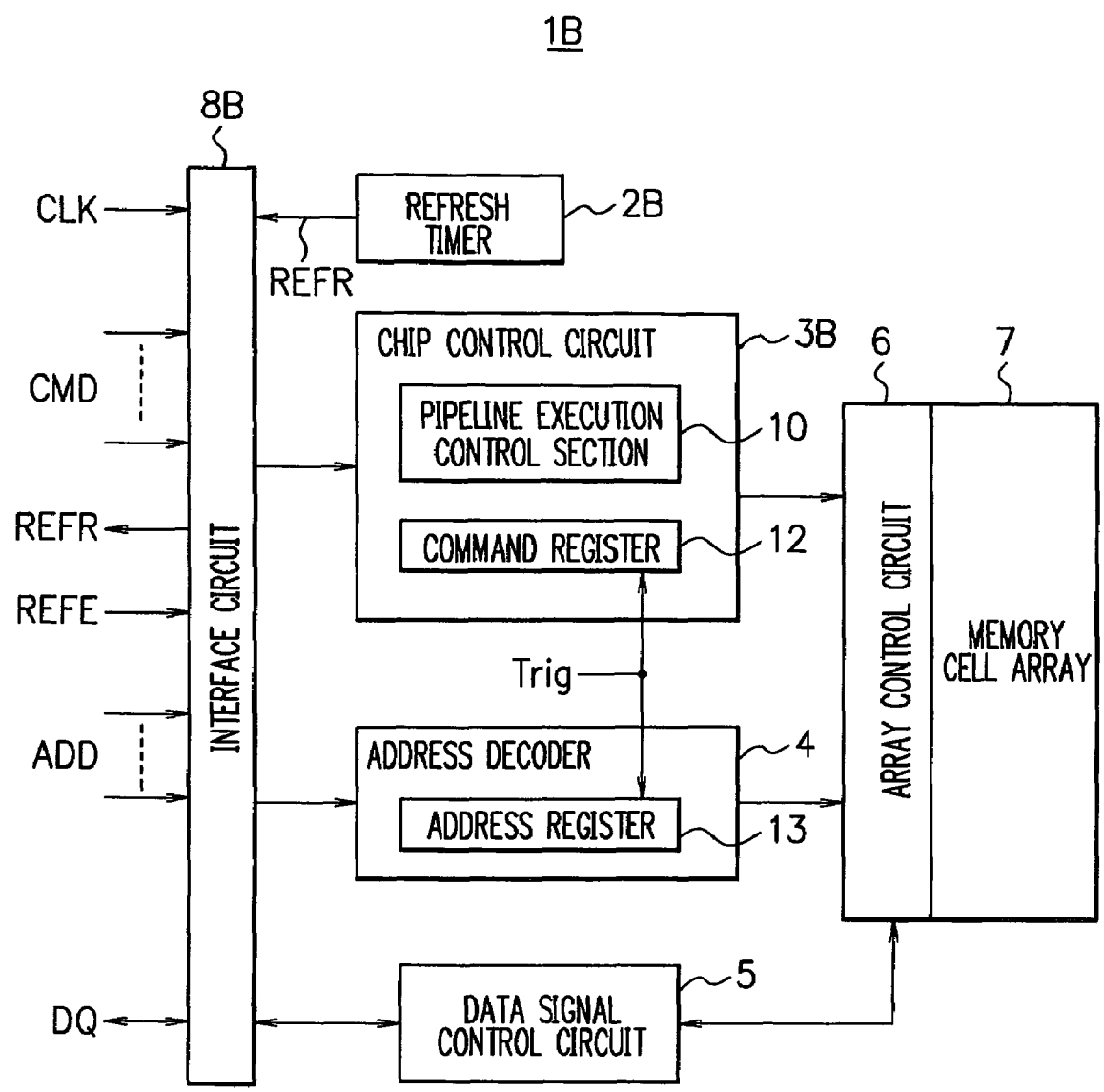
FIG. 14 is a block diagram showing a constitution example of a semiconductor memory device according to a second embodiment of the present invention.

FIG. 14 is a block diagram showing a constitution example of a semiconductor memory device 1B according to the second embodiment of the present invention.

The semiconductor memory device 1B is a pseudo-SRAM and has a refresh timer 2B, a chip control circuit 3B, an address decoder 4, a data signal control circuit 5, an array control circuit 6, a memory cell array 7 and an interface circuit 8B.

The refresh timer 2B clocks time by using a clocking device such as a counter, and outputs a refresh introduction request signal REFR to an outside via the interface circuit 8B each time a predetermined time period elapses. The refresh timer 2B corresponds to the refresh request circuit in the present invention. The refresh introduction request signal REFR is a signal requiring a refresh signal (command) REFE to instruct to execute a refresh operation for the memory cell array 7.

The chip control circuit 3B has a pipeline execution control section 10 and a command register 12, and performs centralized control of an operation of each circuit in the semiconductor memory device 1B.

More specifically, the chip control circuit 3B is supplied with a command (external command) CMD and a refresh signal (command) REFE from an outside via the interface circuit 8B. The chip control circuit 3B decodes them by a decoder not shown, and outputs a control signal to the array control circuit 6 based on the decoded result.

The command register 12 is a register which holds a decoded result obtained by decode in the chip control circuit 3B.

The pipeline execution control section 10 will be described later.

The address decoder 4 decodes an address signal ADD from the outside, which is supplied via the interface circuit 8B, and outputs a selection address signal based on the decoded result to the array control circuit 6. The address decoder 4 has an address register 13 which holds the decoded result obtained by decoding the address signal ADD. The decoded results held in the address register 13 and the command register 12 relate to the same request. The decoded results held in the command register 12 and the address register 13 are outputted in sync with each other based on a trigger signal Trig.

The processing circuit in the present invention is constituted by the chip control circuit 3B and the address decoder 4.

The data signal control circuit 5 controls transmission and reception of a data signal DQ between the inside and the outside of the semiconductor memory device 1B via the interface circuit 8B in the read operation and write operation for the memory cell array 7 which are performed corresponding to the command CMD from the outside.

The array control circuit 6 executes a data read operation, a data write operation and a refresh operation related to the memory cells in the memory cell array 7 based on the control signal supplied from the chip control circuit 3B and the selection address signal supplied from the address decoder 4.

The memory cell array 7 has a plurality of memory cells placed in an array form with respect to the row direction and the column direction. More specifically, the memory cell array 7 has a plurality of bit lines and a plurality of word lines provided to intersect the bit lines, and memory cells are placed at intersecting portions of the bit lines and the word lines. Each of the memory cells is constituted of a 1T-1C type (one transistor and one capacitor type) memory cell as DRAM, and stores one-bit data.

The memory cell array 7 has sense amplifiers provided to correspond to the bit lines.

The interface circuit 8B is a circuit for transmitting and receiving each signal between the inside and the outside of the semiconductor memory device 1B. The command CMD, the address signal ADD and the refresh signal REFE are inputted into the interface circuit 8B from the outside, and the interface circuit 8B outputs the refresh introduction request signal REFR to the outside. The data signal DQ is inputted into and outputted from the interface circuit 8B. A clock signal CLK for synchronizing the input and output timings of the command CMD, the data signal DQ and the like is inputted from the outside therein, and is supplied to each circuit in the semiconductor memory device 1B.

Figure 15:
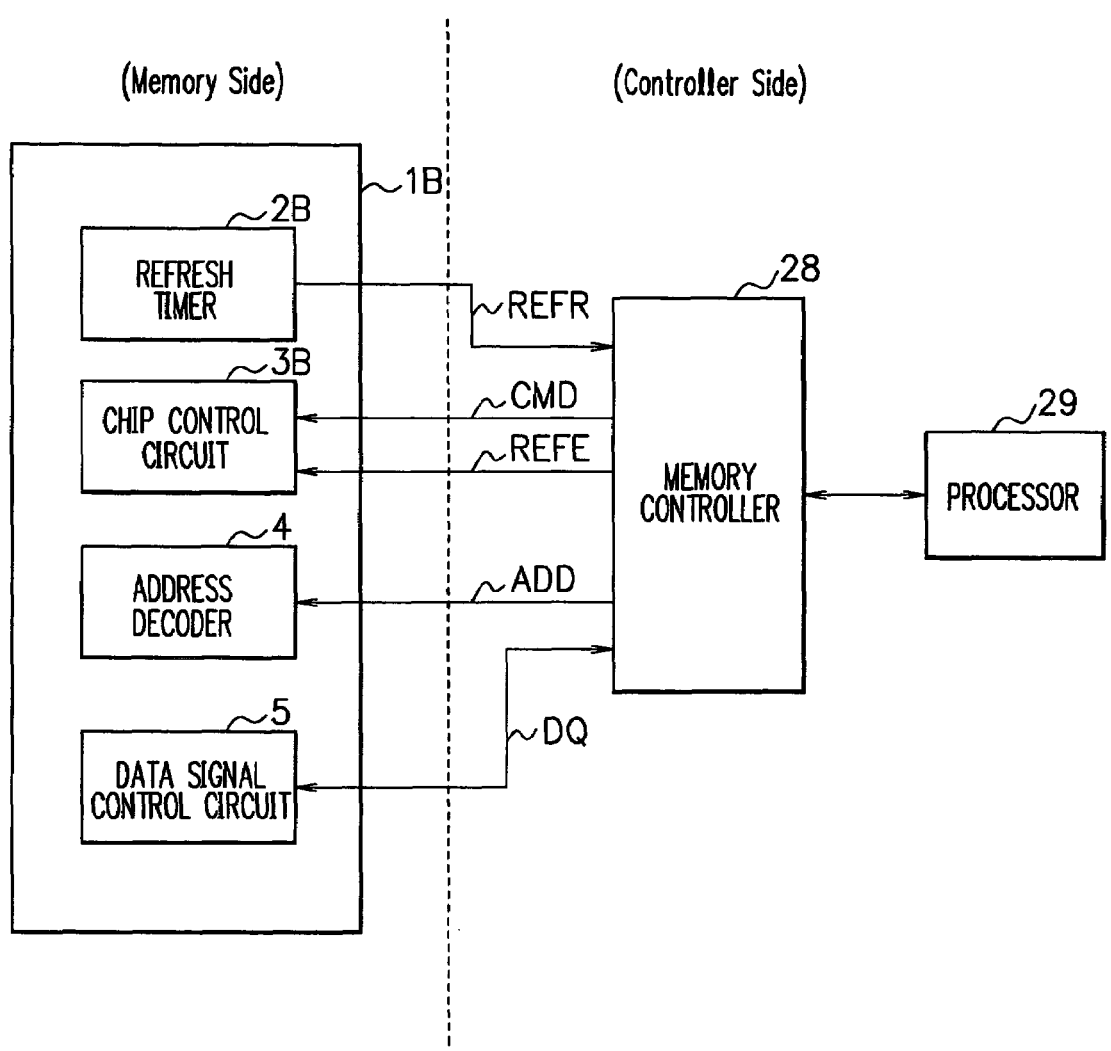
FIG. 15 is a block diagram showing a constitution example of a memory system to which the semiconductor memory device according to the second embodiment is applied.

FIG. 15 is a diagram showing a constitution example of a memory system using the semiconductor memory device 1B shown in FIG. 14. In FIG. 15, the semiconductor memory device 1B is shown in the drawing by being simplified, blocks and the like having the same functions as the blocks and the like shown in FIG. 14 are given the same reference numerals and symbols, and the redundant explanation will be omitted.

The refresh introduction request signal REFR which is outputted from the refresh timer 2B is inputted into a memory controller 28. The command CMD and the refresh signal REFE which are outputted from the memory controller 28 are inputted into the chip control circuit 3B, and the address signal ADD which is outputted from the memory controller 28 is inputted into the address decoder 4. The data signal DQ is inputted into and outputted from the memory controller 28 and the data signal control circuit 5.

The memory controller 28 controls the semiconductor memory device 1B based on the request from a processor 29 or the like. For example, when the memory controller 28 receives a refresh request by the refresh introduction request signal REFR from the semiconductor memory device 1B, the memory controller 28 outputs the refresh signal REFE within a fixed time period after reception. When the memory controller 28 receives an access request (read or write of data) to the semiconductor memory device 1B from the processor 29, the memory controller 28 outputs the command CMD and the address signal ADD corresponding to the access request. The memory controller 28 performs arbitration processing of the access request to the semiconductor memory device 1B from the processor 29 and the refresh request by the refresh introduction request signal REFR, and outputs the command CMD or the refresh signal REFE in accordance with the arbitration result.

As describe above, in the memory system using the semiconductor memory device 1B, the refresh signal REFE to execute the refresh operation in the semiconductor memory device 1B is outputted based on the refresh introduction request signal REFR which is outputted from the refresh timer 2B in the semiconductor memory device 1B. Accordingly, the semiconductor memory device 1B itself controls the execution timing of the refresh operation. Therefore, it is not necessary to include a timer or the like for controlling the execution timing of the refresh operation in the memory controller 28, and it is not necessary to consider the execution timing of the refresh operation, on the controller side. As a result, the memory system as shown in FIG. 15 can be realized in the same conventional system, and if a new system is constructed, it can be constructed easily.

The pipeline execution control section 10 shown in FIG. 14 has the NAND circuits 31, 32, 33 and 38, the NOR circuit 39, the inverters 30, 36 and 37, and the transfer gate 40 constituted of the P-channel transistor 34 and the N-channel transistor 35, as shown in FIG. 7. In the second embodiment, CMDA represents a normal command which is singly inputted and a precedent command in the pipelined operation (which will be described later) that is the feature of this embodiment, and CMDB (P) represents a command relating to the pipelined operation subsequent to the precedent command. CE and /CE each represent a chip enable signal that is one of the command.

The command CMDB (P) relating to the pipelined operation and the chip enable signal CE are inputted into the NAND circuit 31, and the output of the NAND circuit 31 is inputted into the NAND circuit 32. The output of the NAND circuit 33 is inputted into the NAND circuit 32. The outputs of the NAND circuits 32 and 38 are inputted into the NAND circuit 33. Namely, the NAND circuits 32 and 33 constitute an RS flip-flop.

The output of the NAND circuit 32 is capable of being inputted into the inverter 36 via the transfer gate 40 controlled by the chip enable signals CE and /CE. The inverters 36 and 37 have their input terminals connected to the output terminals of the different inverters from themselves, and constitute a latch circuit.

The output of the inverter 36 is inputted into the inverter 30, the output of this inverter 30 and the chip enable signal CE are inputted into the NAND circuit 38, and the output of the NAND circuit 38 is inputted into the NOR circuit 39. The command CMDA is inputted into the NOR circuit 39, and the output of the NOR circuit 39 is outputted as the execution command CMDE.

When the command CMDB to perform the pipelined operation is inputted during execution of the command CMDA (at this time, the chip enable signal CE is "H" (/CE is "L")) in the pipeline execution control section 10, the command CMDB is latched in the RS flip-flop constituted of the NAND circuits 32 and 33 via the NAND circuit 31.

When the chip enable signal CE changes to "L" (/CE changes to "H") to stop (terminate) the operation relating to the command CMDA thereafter, the command CMDB is transferred to the latch constituted of the inverters 36 and 37 via the transfer gate 40. When the chip enable signal CE becomes "H" again, the command CMDB is outputted as an execution command CMDE via the NAND circuit 38 and the NOR circuit 39.

Each of the command register 12 and the address register 13 shown in FIG. 14 is constituted by using a predetermined number of register circuits 51 shown in FIG. 9 in accordance with necessity.

The register circuit 51 has the inverters 52, 55 and 56, and the transfer gate 57 constituted of the P-channel transistor 53 and the N-channel transistor 54.

In the register circuit 51, the clock signal CLK is supplied to a control terminal (gate) of the transistor 53 via the inverter 52, and is supplied to a control terminal (gate) of the transistor 54. The input signal IN is capable of being inputted into the inverter 55 via the transfer gate 57, and the output of the inverter 55 is outputted as the output signal OUT. The input terminals and the output terminals of the inverters 55 and 56 are connected to each other, and constitute the latch circuit.

The array control circuit 6 shown in FIG. 14 is constituted as in FIG. 10.

In the array control circuit 6, the block selection instruction circuit 61, a word line selection instruction circuit 62, a sense amplifier selection instruction circuit 63, a column line selection instruction circuit 64 and an amplifier activation instruction circuit 65 control the operation timings of the respective corresponding block selection circuit 66, word line selection circuit 67, sense amplifier activation circuit 68, column line selection circuit 69 and amplifier activation control circuit 70.

The block selection circuit 66 selectively activates a bit line transfer signal line BT and inactivates a precharge signal line BRS in accordance with a block selection address signal BLSA supplied from the address decoder 4. The word line selection circuit 67 selectively activates the word line WL corresponding to the word line selection address signal WLSA which is supplied from the address decoder 4. The sense amplifier activation circuit 68 activates the sense amplifier driving signal line LE. The column line selection circuit 69 selectively activates the column line CL corresponding to the column line selection address signal CLSA which is supplied from the address decoder 4. The amplifier activation control circuit 70 activates the amplifier driving signal line AEN for driving an amplifier 71. The amplifier 71 amplifies the data which is read from the memory cell array 7 and outputs it to the data signal control circuit 5.

The operations of the respective circuits 66 to 70 activating the signal lines (including the selecting operation) are sequentially performed based on the instructions from the corresponding instruction circuits 61 to 65.

More specifically, an instruction is outputted to the block selection circuit 66 from the block selection instruction circuit 61 first based on the control signal which is supplied from the chip control circuit 3B and the array selection address signal ARSA which is supplied from the address decoder 4. Subsequently, under the condition that the instruction from the block selection instruction circuit 61 is outputted, an instruction is outputted to the word line selection circuit 67 from the word line selection instruction circuit 62.

Thereafter, instructions are sequentially outputted similarly from the sense amplifier selection instruction circuit 63 to the sense amplifier activation circuit 68, from the column line selection instruction circuit 64 to the column line selection circuit 69, and from the amplifier activation instruction circuit 65 to the amplifier activation control circuit 70. It should be noted that the instruction from the amplifier activation instruction circuit 65 to the amplifier activation control circuit 70 is outputted on the condition that the instructions are outputted from both the sense amplifier selection instruction circuit 63 and the column line selection instruction circuit 64.

The memory cell array 7 shown in FIG. 14 is constituted as in FIG. 11A. Information of one bit is stored in the capacitor C1 of a memory cell 81. An operation when the data stored in this memory cell 81 (capacitor C1) is the same as shown in FIG. 11B.

When none of a data read operation, a data write operation and a refresh operation are executed, bit line transfer signal lines BT0 and BT1 and precharge signal lines BRS are activated, and are "H". Accordingly, the transistors NT3 to NT5 and NT13 to NT15 in the precharge circuits 82 and 85, and the transistors NT6, NT7, NT16 and NT 17 are in conduction, and the potentials of the bit lines BL and /BL are equal potentials.

On reading the data, the bit line transfer signal line(s) other than the bit line transfer signal line BT0 corresponding to the memory cell 81, and the precharge signal lines BRS are inactivated to make them "L". Accordingly, the precharge circuits 82 and 85 are in the non-operating state, and the transistors NT16 and NT17 are in the non-conduction state (release of the reset state of the sense amplifier 83). The bit line transfer signal line BT0 keeps "H".

Next, when a word line WL is selectively activated and becomes "H", the transistor NT1 is brought into conduction, and the data stored in the capacitor C1 is read out to the bit line BL. Thereby, the potential of the bit line BL changes in accordance with the data stored in the capacitor C1 (SQ1). Here, the transistors NT6 and NT7 are in the conduction state, and the transistors NT16 and NT17 are in the non-conduction state. Therefore, the data (potential) of the bit lines BL and /BL are supplied to the sense amplifier 83 via the transistors NT6 and NT7.

Next, when a sense amplifier drive signal line LE is activated and becomes "H", the transistors NT8 and PT1 are brought into conduction to perform power source supply, thereby operating the sense amplifier 83, and the data of the bit lines. BL and /BL are amplified (SQ2). Subsequently, when the column line CL is selectively activated and becomes "H", the transistors NT9 and NT10 as column gates are brought into conduction, and the amplified data of the bit lines BL and /BL are outputted to the data buses DB and /DB (SQ3).

Thereafter, the column line CL is inactivated and changed to "L", and after rewrite of the read data to the memory cell 81 (capacitor C1) is performed (SQ4), the word line WL is inactivated and changed to "L". Further, after the sense amplifier 83 is brought into the non-operating state by inactivating the sense amplifier drive signal line LE and changing it to "L", all the bit line transfer signal lines BT0 and BT1, and precharge signal lines BRS are activated and the data read operation is finished.

The data write operation to the memory cell 81 is the same as the conventional art, and the explanation will be omitted.

Figure 16A:
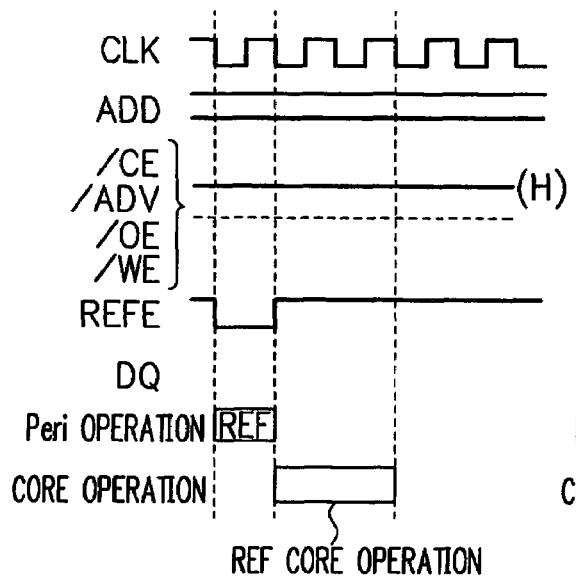
FIGS. 16A to 16C are diagrams for explaining a refresh operation in the second embodiment.
Figure 16B:
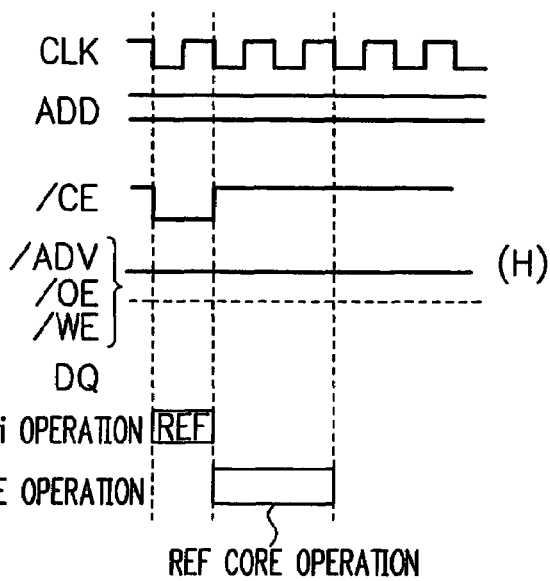
Figure 16C:
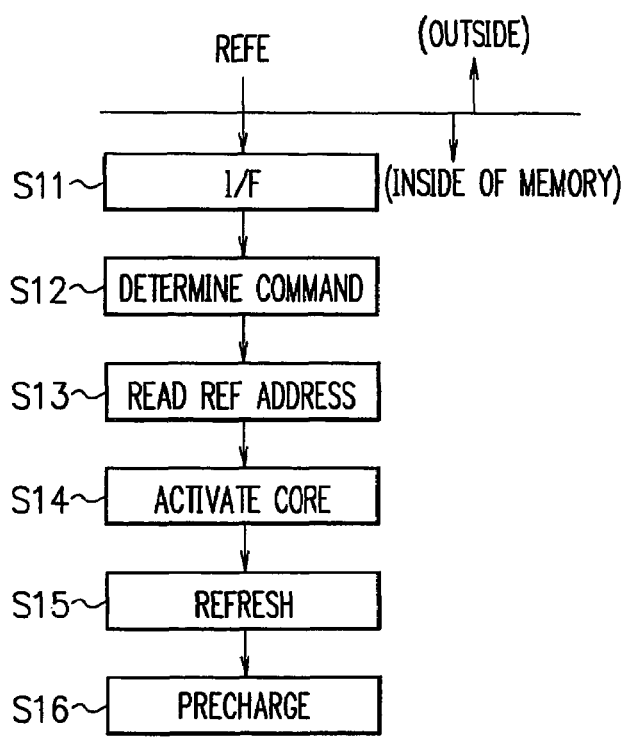

FIGS. 16A to 16C are diagrams for explaining the refresh operation of the semiconductor memory device 1B according to the second embodiment.

FIG. 16A shows a drive waveform of the command CMD and the refresh signal REFE which are supplied so that the refresh operation is executed in the semiconductor memory device 1B shown in FIG. 14. When the semiconductor memory device 1B includes a dedicated terminal (dedicated pin) for inputting the refresh signal REFE, the refresh signal REFE is changed to "L" in a pulse form in the state in which all signals of the command CMD (/CE, /ADV, /OE, /WE) are inactivated ("H") as shown in FIG. 16A, and thereby the refresh operation is executed in the semiconductor memory device 1B.

When the refresh operation is to be executed by the command CMD without providing a dedicated terminal for inputting the refresh signal REFE in the semiconductor memory device 1B, the chip enable signal /CE is changed to "L" in the pulse form in the state in which the command CMD other than the chip enable signal /CE are inactivated as shown in FIG. 16B, for example, and thereby the refresh operation may be executed in the semiconductor memory device 1B. When the refresh operation is to be executed by only the command CMD like this, it is suitable to previously specify a dedicated command for executing the refresh operation.

FIG. 16C is a diagram showing a flow of the refresh operation in the semiconductor memory device 1B. When the execution of the refresh operation is instructed by the refresh signal REFE (or the dedicated command as described above) which is supplied from the outside, the refresh signal REFE is taken into the semiconductor memory device 1B via the interface circuit 8B (S11), and the chip control circuit 3B performs command determination and determines that it is the refresh operation (S12). Subsequently, the address of the memory which will be performed the refresh operation is read (S13), and the core (the array control circuit 6 and the memory cell array 7) is activated (S14). The array control circuit 6 performs a refresh operation for the memory cell corresponding to the address which is read in step S13 (S15) in the memory cell array 7, and precharge is performed and the processing is finished (S16).

FIGS. 17A and 17B are diagrams showing command examples of the semiconductor memory device 1B according to the second embodiment.

FIG. 17A shows command examples in the case in which the semiconductor memory device 1B includes a dedicated terminal in which the refresh signal REFE is inputted.

In a read command RD for performing a data read operation, the signals /CE and /OE are "L", and the signals /WE and REFE are "H". In a write command WR for performing a data write operation, the signals /CE and /WE are "L", and the signals /OE and REFE are "H".

In the refresh command REF for performing a refresh operation, only the signal REFE is "L", and the other signals /CE, /OE and /WE are "H". When the signals /CE and REFE are "H", the semiconductor memory device 1B is in a standby state which is a waiting state (non-operating state).

FIG. 17B shows command examples specified by only the command CMD when the semiconductor memory device 1B does not include a dedicated terminal for inputting the refresh signal REFE therein.

The read command RD and the write command WR are the same as the example shown in FIG. 17A except that they do not have the signal REFE. When the signal /CE is "H", the semiconductor memory device 1B is in the standby state which is a waiting state (non-operating state).

For the refresh command REF, the signal /CE is changed to "L" in the pulse form in the state in which the signals /OE and /WE are "H".

Next, a pipelined operation in the semiconductor memory device 1B according to the second embodiment will be explained.

Figure 18:
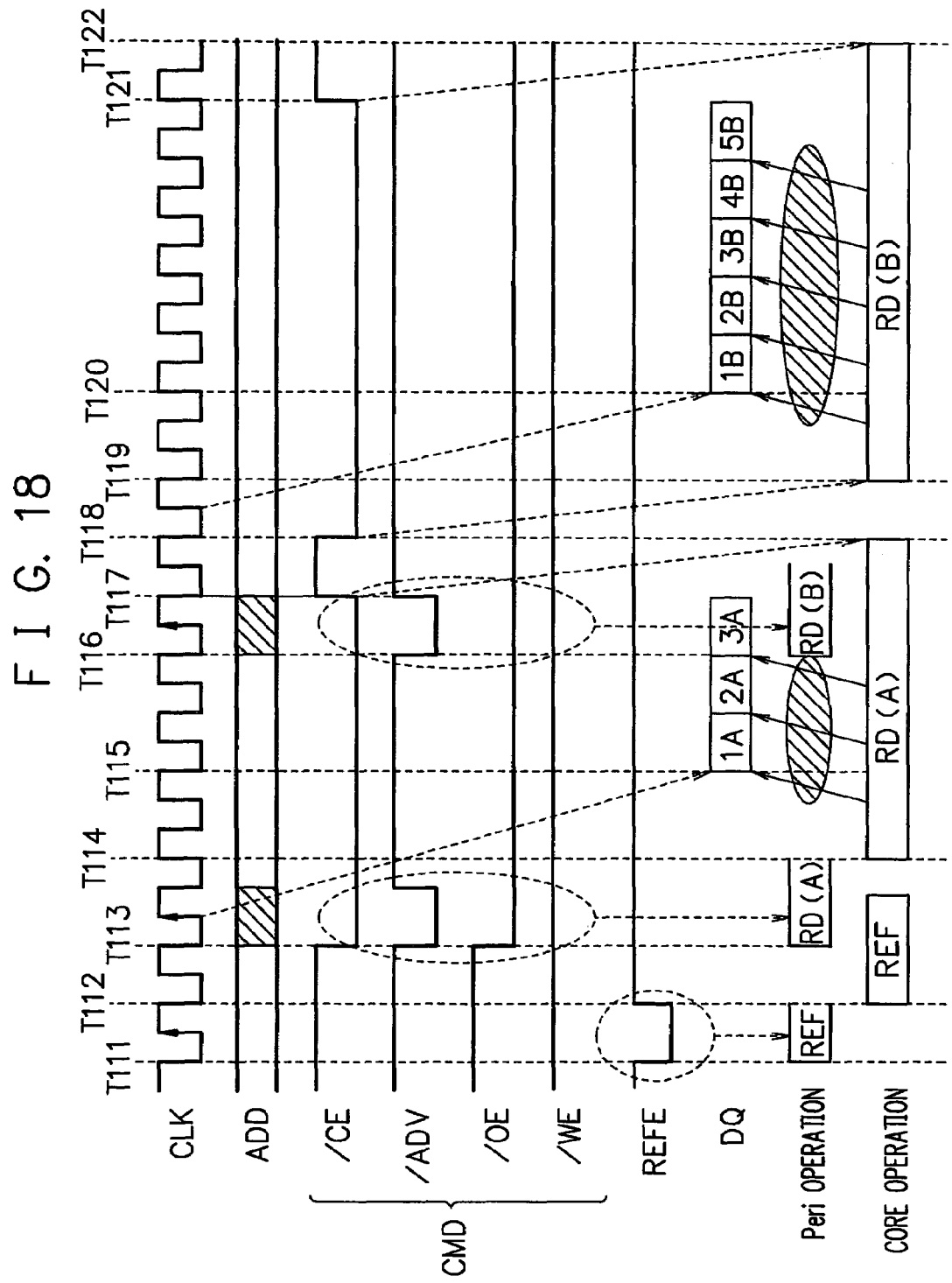
FIG. 18 is a timing chart showing an operation example of the semiconductor memory device according to the second embodiment.

FIG. 18 is a timing chart showing an operation example of the semiconductor memory device according to the second embodiment. In FIG. 18, the case in which the semiconductor memory device 1B which uses the chip enable signal /CE that brings the semiconductor memory device 1B into the operating state, the address valid signal /ADV indicating that the address signal ADD is valid, the output enable signal /OE and the write enable signal /WE as the command CMD, and further uses the refresh signal REFE, executes the refresh operation REF—the data read operation RD (A)—the data read operation RD (B) by the pipelined operation as one example. In FIG. 18, the "core operation" is the selection operation of the memory cell array 7 (the operation which the array control circuit 6 executes for the memory cell array 7), and the "Peri operation" is the operation which is executed by the circuits 2B, 3B, 4, 5 and 8B except for the array control circuit 6 and the memory cell array 7.

First, as the response to the output of the refresh introduction request signal REFR from the refresh timer 2B via the interface circuit 8B, the refresh signal REFE changes to "L" at a time T111. The chip control circuit 3B decodes the command CMD and the refresh signal REFE, and determines that the refresh operation is requested from the outside.

At a time T112, the refresh signal REFE changes to "H", and the refresh core operation is executed in the memory cell array 7.

At a time T113 in which the refresh core operation is under execution in the memory cell array 7, the chip enable signal /CE, the address valid signal /ADV and the output enable signal /OE change to "L". The chip control circuit 3B decodes this command CMD, and determines that the access request from the outside is the data read operation RD (A). The address decoder 4 takes in the address signal ADD and decodes it. At this time, the refresh operation is under execution as the core operation, and therefore the chip control circuit 3B and the address decoder 4 hold the respective decoded results relating to the data read operation RD (A) in the command register 12 and the address register 13.

In this embodiment, the read command is inputted at the time T113, but the control side previously knows the time required for the refresh operation as the core operation, and therefore the read command is inputted after a predetermined time elapses after the refresh signal REFE is changed.

Thereafter, the address valid signal /ADV changes to "H".

At a time T114, when the refresh operation as the core operation finishes, execution of the data read operation RD (A) as the core operation is instructed by the pipeline execution control section 10 in the chip control circuit 3B, and the execution of the data read operation RD (A) for the memory cell array 7 is started based on the decoded results held in the command register 12 and the address register 13. As a result, from a time T115, data (1A), (2A) and (3A) of the memory cells corresponding to the decoded result held in the address register 13 are sequentially read and outputted as the data signal DQ.

At a time T116 in which the data read operation RD (A) is under execution for the memory cell array 7, when the address valid signal /ADV changes to "L", the chip control circuit 3B decodes the command CMD, and determines that the access request from the outside is the data read operation RD (B). The address decoder 4 takes in the address signal ADD and decodes it. At this time, the operation RD (A) as the core operation is under execution in the memory cell array 7, and therefore, the chip control circuit 3B and the address decoder 4 hold the respective decoded results relating to the data read operation RD (B) in the command register 12 and the address register 13.

Next, at a time T117, the address valid signal /ADV and the chip enable signal /CE change to "H". The chip control circuit 3B instructs termination of the data read operation RD (A) to the array control circuit 6 by the chip enable signal /CE changing to "H", and at a time T118, the data read operation RD (A) executed in the memory cell array 7 is finished. The command for terminating the operation by changing the chip enable signal /CE to "H" when the bust operation is performed in the data read operation or the like as above is called a termination command.

At the time T118, when the chip enable signal /CE changes to "L" again, execution of the data read operation RD (B) as the core operation is instructed by the pipeline execution control section 10 in the chip control circuit 3B. At a time T119, the execution of the data read operation RD (B) for the memory cell array 7 is started based on the decoded results held in the command register 12 and the address register 13.

From a time T120, data (1B), (2B), (3B), (4B) and (5B) of the memory cells corresponding to the decoded result held in the address register 13 are sequentially read and outputted as the data signal DQ. At a time T121, the chip enable signal /CE changes to "H", namely, the termination command is issued, and thereby, the data read operation RD (B) as the core operation terminates at a time T122.

Figure 19:
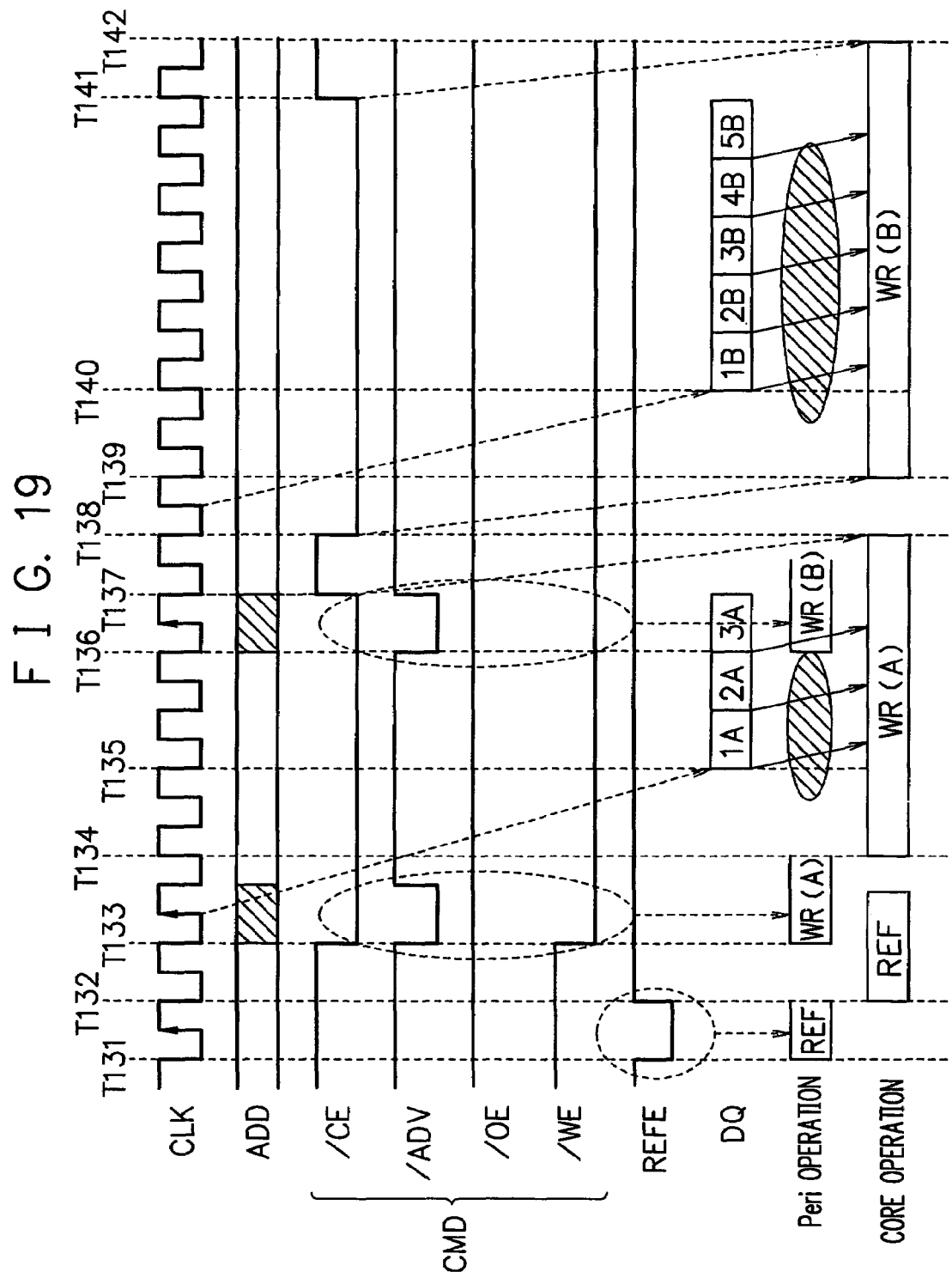
FIG. 19 is a timing chart showing another operation example of the semiconductor memory device according to the second embodiment.

FIG. 19 is a timing chart showing another operational example of the semiconductor memory device according to the second embodiment. FIG. 19 shows the case, in which the semiconductor memory device 1B using the chip enable signal /CE, the address valid signal /ADV, the output enable signal /OE and the write enable signal /WE as the command CMD, and further using the refresh signal REFE executes the refresh operation REF—the data write operation WR (A)—the data write operation WR (B) by the pipelined operation, as one example.

The operation of which timing chart is shown in FIG. 19 only differs in the respect that the write enable signal /WE is changed to "L" in place of the output enable signal /OE and the data supplied by the data signal DQ is written into the memory cell, and is the same as the operation example of which timing chart is shown in FIG. 18 in the operation inside the semiconductor memory device 1B, and therefore the detailed explanation will be omitted. Times T131 to T142 in FIG. 19 respectively correspond to the times T111 to T122 shown in FIG. 18.

According to the second embodiment, the operation for the memory cell array including the refresh operation is requested with only the access request from the outside. Therefore, it is not necessary to provide a refresh entry term between the respective operations as in the conventional art, and the latency in the data read operation and the cycle time in the data write operation can be shortened, thus making it possible to increase the number of accessible times per unit time, enhance bus occupancy relating to the data signal DQ and realize speeding up of the access operation. The command register 12 and the address register 13 for holding the decoded results are provided, and the pipelined operation is realized in the pre-stage and the subsequent stage, whereby bus occupancy relating to the data signal DQ can be further enhanced, and speeding-up of the access operation can be realized. For example, speeding-up of the processing can be realized when the semiconductor memory device is used in the circuit relating to image processing and real time processing, for example.

Third Embodiment

Next, a third embodiment of the present invention will be explained.

Figure 20:
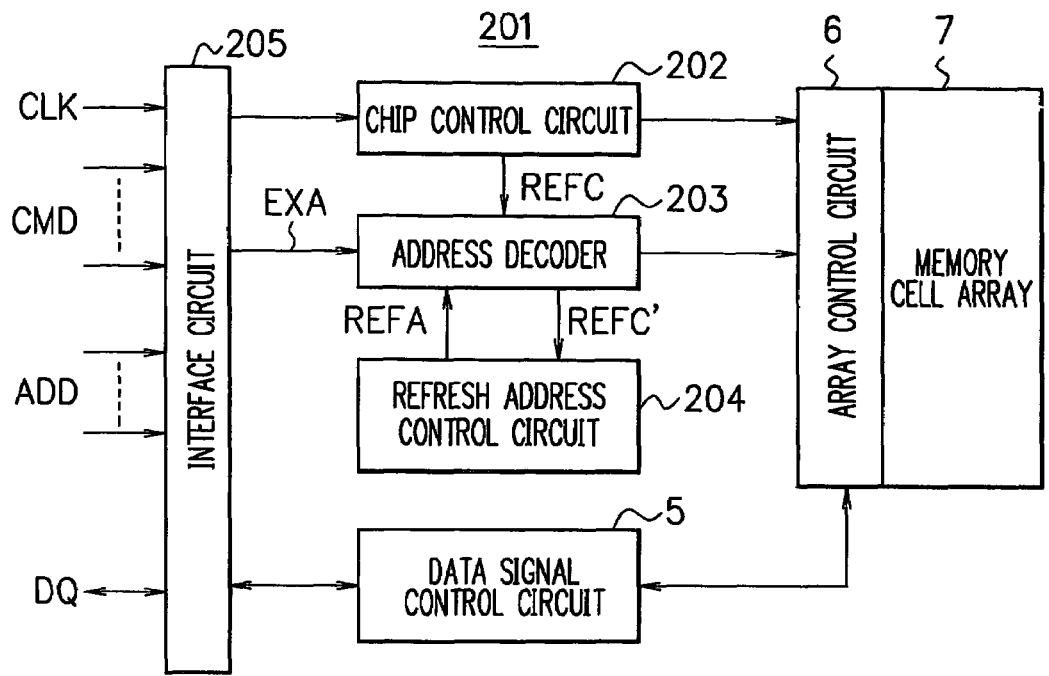
FIG. 20 is a block diagram showing an example of a basic constitution of a semiconductor memory device according to a third embodiment of the present invention.

FIG. 20 is a diagram showing a basic constitution of a semiconductor memory device 201 according to a third embodiment of the present invention. In FIG. 20, the blocks and the like having the same functions as the blocks and the like shown in FIG. 5 and FIG. 14 are given the same reference numerals and symbols, and the redundant explanation will be omitted.

The semiconductor memory device 201 is a pseudo-SRAM, and has a chip control circuit 202, an address decoder 203, a refresh address control circuit 204, a data signal control circuit 5, an array control circuit 6, a memory cell array 7 and an interface circuit 205.

The chip control circuit 202 performs centralized control of the operation of each circuit in the semiconductor memory device 201. The chip control circuit 202 is supplied with command (external command) CMD and the address signal ADD from an outside via the interface circuit 205. The chip control circuit 202 decodes them by a decoder not shown, and outputs a control signal to the array control circuit 6 based on the decoded result.

In the case of a predetermined combination of the address signal ADD and the command CMD, the chip control circuit 202 determines it as the request for the refresh operation, and generates the refresh command REFC and outputs it. Namely, the chip control circuit 202 determines that it is the request for the refresh operation by accessing a specified address. This access is set as, for example, normal commands (data read, data write) or the combination of them (for example, data read—data read, or data read—data write—data write). In the case of the predetermined combination of the address signal ADD and the command CMD, an access operation to the memory cell array 7 is not performed, and data is not read from the memory cell.

The address decoder 203 selectively decodes the address signal ADD from the outside which is supplied via the interface circuit 205 or a refresh address signal REFA which is supplied from the refresh address control circuit 204 in response to the refresh command REFC, and outputs the selection address signal based on the decoded result to the array control circuit 6.

The refresh address control circuit 204 has an internal counter. The refresh address control circuit 204 operates the counter based on a refresh command REFC', which is supplied from the address decoder 203, and outputs the signal REFA indicating the refresh address instructed in accordance with the counter value to the address decoder 203.

The interface circuit 205 is a circuit for transmitting and receiving each signal between the inside and the outside of the semiconductor memory device 201. The command CMD and the address signal ADD are inputted into the interface circuit 205 from the outside. The data signal DQ is inputted into and outputted from the interface circuit 205. The clock signal CLK for synchronizing the input and output timings of the command CMD, the data signal DQ and the like are inputted from the outside, and are supplied to each circuit in the semiconductor memory device 201.

Figure 21A:
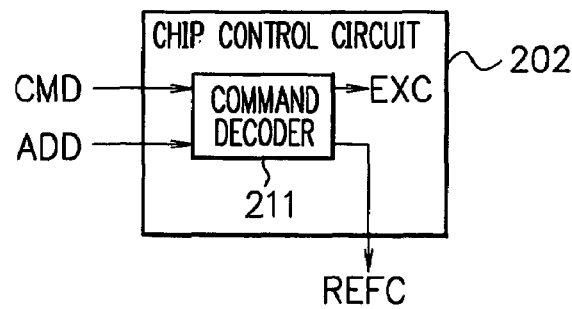
FIGS. 21A and 21B are diagrams for explaining a chip control circuit in the third embodiment.
Figure 21B:
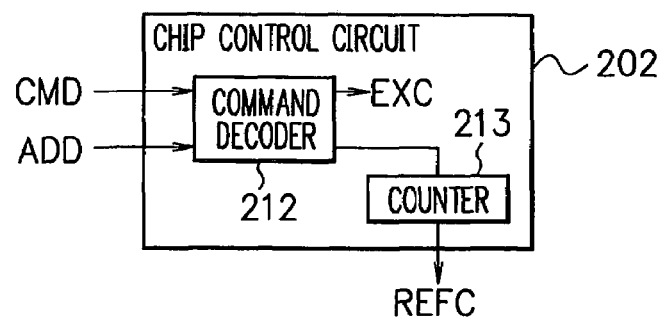

FIGS. 21A and 21B are diagrams showing the chip control circuit 202 shown in FIG. 20.

The chip control circuit 202 has a command decoder 211 as shown in FIG. 21A. The command CMD and the address signal ADD are inputted into the command decoder 211, and the command decoder 211 decodes them. Further, the command decoder 211 outputs an execution command EXC or a refresh command REFC in accordance with the decoded result. The refresh command REFC is outputted in the case of the predetermined combination of the address signal ADD and command CMD.

The chip control circuit 202 shown in FIG. 21A is constituted to output the refresh command REFC every time the predetermined combination of the address signal ADD and command CMD is inputted, but the chip control circuit 202 is not limited to this, and the chip control circuit 202 may be constituted as shown in FIG. 21B, for example.

The chip control circuit 202 shown in FIG. 21B has a command decoder 212 and a counter 213, and the command decoder 212 corresponds to the command decoder 211 shown in FIG. 21A. In the chip control circuit 202 shown in FIG. 21B, the counter value of the counter 213 is incremented (may be decremented) every time the predetermined combination of the address signal ADD and the command CMD is inputted. When the counter value becomes a predetermined value, the counter 213 outputs the refresh command REFC. Namely, the chip control circuit 202 shown in FIG. 21B outputs the refresh command REFC when the predetermined combination of the address signal ADD and the command CMD are inputted a predetermined number of times.

Figure 22:
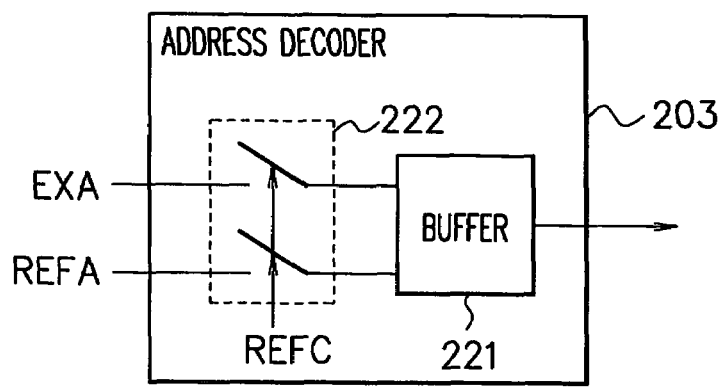
FIG. 22 is a diagram for explaining an address decoder in the third embodiment.

FIG. 22 is a diagram showing a constitution of the address decoder 203 shown in FIG. 20.

The address decoder 203 has a buffer 221 and a selector 222. An address EXA based on the address signal ADD from the outside and a refresh address REFA are inputted into the selector 222, and the selector 222 selectively outputs the address EXA or REFA in accordance with the refresh command REFC to the buffer 221. For example, the selector 222 outputs the address REFA when the refresh command REFC is "H", and outputs the address EXA when the refresh command REFC is "L". Further, the address inputted into the buffer 221 is outputted from the address decoder 203.

Figure 23A:
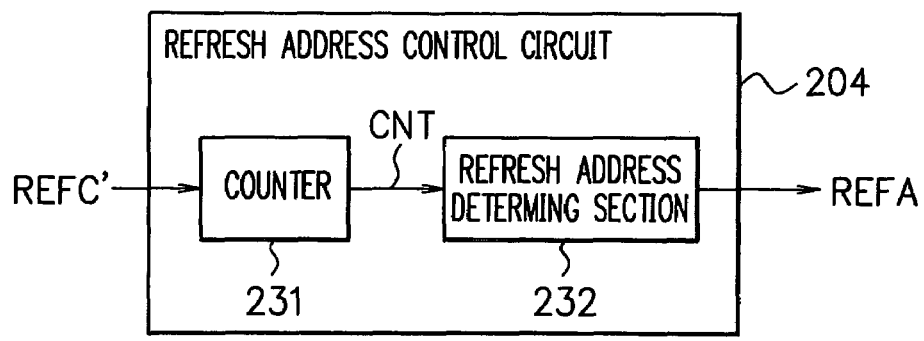
FIG. 23A is a diagram for explaining a refresh address control circuit in the third embodiment.

FIG. 23A is a diagram for explaining the refresh address control circuit 204 shown in FIG. 20. The refresh address control circuit 204 has a counter 231 and a refresh address determining section 232 as shown in FIG. 23A. The counter 231 increments (may decrement) a counter value CNT every time a refresh command REFC' is inputted, and outputs the counter value CNT to the refresh address determining section 232. The refresh address determining section 232 determines the refresh address REFA based on the supplied counter value CNT, and outputs it.

Figure 23B:
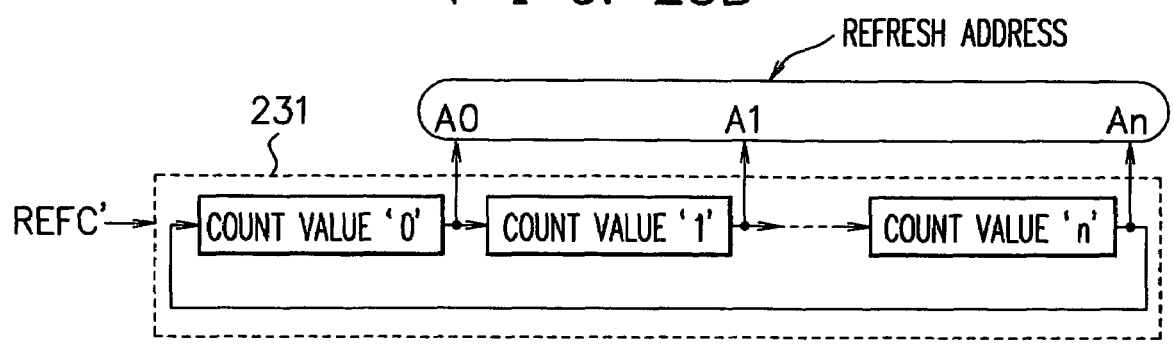
FIG. 23B is a diagram for explaining a refresh address determining method in the refresh address control circuit.

FIG. 23B is a diagram for explaining a determining method of the refresh address REFA in the refresh address control circuit 204. The counter 231 increments the counter value by one every time the refresh command REFC' is inputted. However, if the refresh command REFC' is inputted when the counter value is n, the counter value returns to zero. "n" corresponds to the number of all the word lines which need to be selected to perform the refresh operation in the memory cell array 7. The counter value corresponds to the refresh address by one to one. When, for example, the counter value is zero, A0 is selected and determined as the refresh address REFA, and when the counter value is 1, A1 is selected and determined as the refresh address REFA.

Figures 24, 25:
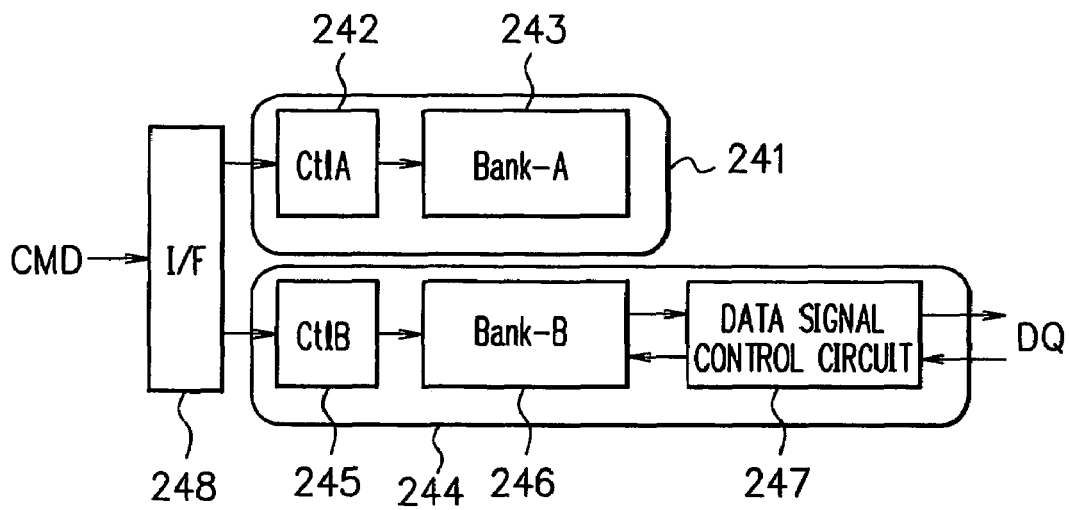
FIG. 24 is a diagram for explaining an operation of the semiconductor memory device according to the third embodiment.
FIG. 25 is a diagram showing command examples of the semiconductor memory device according to the third embodiment.

FIG. 24 is a diagram for explaining the operation of the semiconductor memory device according o the third embodiment.

In FIG. 24, reference numeral 241 denotes a circuit relating to a bank A, and includes a bank A 243 in the memory cell array 7 and a control circuit 242 for controlling it. Reference numeral 244 denotes a circuit relating to a bank B, and includes a bank B 246 in the memory cell array 7 and a control circuit 245 for controlling it and a data signal control circuit 247. Reference numeral 248 denotes an interface circuit. Each of the control circuits 242 and 245 is shown as one block, but has the functions of the chip control circuit 202, the address decoder 203, the refresh address control circuit 204 and the like shown in FIG. 20.

As a result that the control circuits 242 and 245 are included respectively for the banks 241 and 246 in the memory cell array 7, independent control can be made for each of the banks 241 and 246. Thus, it is made possible to access the bank B 246 while performing the refresh operation in the bank A241, for example, and it is possible to access one bank in which refresh operation is not performed and perform read and write of the data while the refresh operation is performed in the other bank.

FIG. 25 is a diagram showing one example of a refresh command in the semiconductor memory device according to the third embodiment.

Irrespective of which bank the refresh operation is performed for, the signals /CE and /OE are "L" and the signal /WE is "H" in the case of the refresh command. Designation of the bank for performing the refresh operation is performed by using a part of the address signal ADD (in FIG. 25, the address signal ADD corresponding to the bits A0 to A2).

According to the present invention, the register for holding the decoded result of the information relating to the external access request is provided, and the decode of the information relating to the external access request supplied from the outside, and the operation corresponding to the external access request in the memory cell array are made executable independently in parallel, whereby the access request from the outside can be inputted in multiple, and the pipelined operation can be realized for the decode and the operation corresponding to the external access request in the memory cell array, thus making it possible to speed up the access operation without causing any problem.

According to the present invention, the operation for the memory cell array including the refresh operation is controlled by only the external access request by outputting the refresh request signal for requesting the refresh operation to the outside, and therefore it is not necessary to provide a refresh entry term between the respective operations, the time required for the access operation to the memory cell array can be shortened, the number of accessible times per unit time can be increased, and speeding-up of the access operation of the semiconductor memory device can be realized.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A method to control for accessing a memory cell array with a plurality of memory cells, comprising steps of:
   generating a refresh request for requesting a refresh operation to hold the data stored in the memory cells;
   decoding information relating to an external access request to said memory cell array, supplied from an outside;
   holding the decoded result of the information relating to the external access request to a register;
   instructing an operation to be executed in said memory cell array in accordance with the decoded result and a refresh; and
   executing an operation for said memory cell array based on an instruction.

2. The method according to claim 1, comprising:
   holding a decoded result of information relating to a second external access request in said register if the second external access request while executing an operation corresponding to a first external access request in said memory cell array;
   instructing an operation to be executed in said memory cell array based on the decoded result held in said register after the operation corresponding to the first external access request is finished.

3. The method according to claim 2, comprising:
   controlling whether a refresh operation is executed in response to the refresh request or not.

4. The method according to claim 1, comprising:
   making the refresh request stand by when instructing execution of an operation corresponding to the second external access request subsequently to the operation corresponding to the first external access request.

5. The method according to claim 1, comprising:
   making the refresh request stand by when there is at least one of the external access requests.

6. The method according to claim 1, comprising:
   instructing execution of the operation corresponding to the second external access request after the operation corresponding to the first external access request is finished in said memory cell array.

7. The method according to claim 1, comprising:
   performing arbitration of the external access request and the refresh request; and
   instructing an operation to be executed in said memory cell array based on an arbitration result.

8. The method according to claim 1, comprising:
   restricting to perform arbitration of the second external access request and the refresh request if receiving the second external access request while executing the operation corresponding to the first external access request in said memory cell array.

9. The method according to claim 1, comprising: wherein access time relating to the external access request is based on whether receiving the external access request during execution of an operation corresponding to another external access request in said memory cell array or not.

10. The method according to claim 1, wherein the holding step includes holding a decoded result of command information relating to the external access request in a command register and holding a decoded result of address information in an address register.

11. The method according to claim 1, wherein the decoding step includes decoding command information relating to the external access request and decoding address information.

12. The method according to claim 1, wherein the operation relating to the external access request is executed by a pipelined operation.

13. The method according to claim 1, wherein deterring execution of the refresh operation if receiving a second external access request while an operation relating to a first external access request is executed.

14. The method according to claim 1, wherein the information relating to the external access request supplied from the outside includes information indicating a first external access request issued during execution of an operation corresponding to a second external access request in said memory cell array.

15. A method to control for accessing a memory cell array with a plurality of memory cells, comprising steps of:
   generating a refresh request for requesting a refresh operation to hold the data stored in the memory cells;
   starting of an execution of an operation corresponding to a first external access request in said memory cell array;
   receiving a second external access during the execution of an operation corresponding to a first external access request;
   decoding information relating to the second external access request to said memory cell array;
   holding the decoded result to a register; and
   instructing an operation to be executed in said memory cell array in accordance with the decoded result in the register and a refresh request after the operation corresponding to the first external access request is finished.

16. A method to control for accessing a memory cell array with a plurality of memory cells, comprising steps of:
   outputting to an outside a refresh request signal requesting a refresh operation to hold data stored in the memory cells;
   decoding information relating to an external access request to said memory cell array, supplied from the outside;
   instructing an operation to be executed in said memory cell array based on a decoded result; and
   executing an operation for said memory cell array based on an instruction,
   wherein the external access request includes a refresh execution request being a response to a refresh request signal.

17. The method according to claim 16, wherein the refresh execution request is generated based on the refresh request signal.

18. The method according to claim 16, wherein the refresh request signal is outputted every time a fixed time period elapses.

19. The method according to claim 16, wherein a signal by an individual signal line is used as the refresh execution request.

20. The method according to claim 16, wherein a specific command is used as the refresh execution request.

21. The method according to claim 16, comprising: holding a decoded result of information relating to an external access request in a register.

22. The method according to claim 21, wherein the holding step includes holding a decoded result of command information relating to the external access request in a command register and holding a decoded result of address information in an address register.

23. The method according to claim 16, comprising:
holding a decoded result of information relating to the second external access request in a register if receiving a second external access request while executing an operation corresponding to a first external access request in said memory cell array; and
instructing an operation to be executed in said memory cell array based on the decoded result held in said register after the operation corresponding to the first external access request is finished.

24. The method according to claim 23, comprising:
instructing execution of an operation corresponding to the second external access request after the operation corresponding to the first external access request is finished.

25. The method according to claim 16, wherein the operation relating to the external access request is executed by a pipelined operation.

\* \* \* \* \*